(12) United States Patent
You et al.

(10) Patent No.: US 12,543,354 B2
(45) Date of Patent: Feb. 3, 2026

(54) METAL-OXIDE-SEMICONDUCTOR FIELD EFFECT TRANSISTORS INCLUDING NANOSHEETS

(71) Applicant: SAMSUNG ELECTRONICS CO., LTD., Suwon-si (KR)

(72) Inventors: Jung Gun You, Suwon-si (KR); Sug Hyun Sung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 414 days.

(21) Appl. No.: 18/212,817

(22) Filed: Jun. 22, 2023

(65) Prior Publication Data

US 2024/0138137 A1    Apr. 25, 2024
US 2024/0237325 A9    Jul. 11, 2024

(30) Foreign Application Priority Data

Oct. 21, 2022 (KR) .................. 10-2022-0136329

(51) Int. Cl.

| | | |
|---|---|---|
| *H10D 62/10* | (2025.01) | |
| *H10B 10/00* | (2023.01) | |
| *H10D 30/43* | (2025.01) | |
| *H10D 30/67* | (2025.01) | |
| *H10D 62/13* | (2025.01) | |

(52) U.S. Cl.
CPC .......... *H10D 62/121* (2025.01); *H10B 10/18* (2023.02); *H10D 30/43* (2025.01); *H10D 30/6735* (2025.01); *H10D 62/151* (2025.01); *H10D 30/6736* (2025.01)

(58) Field of Classification Search
CPC .. H10D 30/6735; H10D 30/43; H10D 62/121; H10B 10/18
See application file for complete search history.

(56) References Cited

U.S. PATENT DOCUMENTS

| | | |
|---|---|---|
| 8,502,318 B2 | 8/2013 | Thomas et al. |
| 8,629,477 B2 | 1/2014 | Lochtefeld et al. |
| 8,629,478 B2 | 1/2014 | Ko et al. |
| 9,768,305 B2 | 9/2017 | Ko et al. |
| 10,396,169 B2 | 8/2019 | Cheng et al. |
| 10,629,501 B2 | 4/2020 | Doornbos et al. |
| 10,763,177 B1 | 9/2020 | Zhang et al. |
| 10,886,368 B2 | 1/2021 | Zhang et al. |
| 11,342,338 B2 | 5/2022 | Lin et al. |

(Continued)

*Primary Examiner* — Changhyun Yi
(74) *Attorney, Agent, or Firm* — Muir Patent Law, PLLC

(57) ABSTRACT

A semiconductor device includes a substrate including first and second regions; a first active pattern including a first lower pattern and first sheet patterns; a second active pattern including a second lower pattern, a height of the second lower pattern being identical to a height of the first lower pattern, and second sheet patterns; a first gate structure including a first gate insulating film and a first gate electrode; a second gate structure including a second gate insulating film, and a second gate electrode, a width of the second gate electrode being greater than a width of the first gate electrode; a first source/drain pattern on the first lower pattern and connected to the first sheet patterns; and a second source/drain pattern on the second lower pattern and connected to the second sheet patterns, wherein a number of first sheet patterns is smaller than a number of second sheet patterns.

20 Claims, 23 Drawing Sheets

(56) References Cited

U.S. PATENT DOCUMENTS

2017/0162583 A1* 6/2017 Lee .................. H10F 39/80377
2021/0098473 A1* 4/2021 Lin ..................... H10D 62/021
2021/0384311 A1 12/2021 Wu et al.

* cited by examiner

METAL-OXIDE-SEMICONDUCTOR FIELD EFFECT TRANSISTORS INCLUDING NANOSHEETS

CROSS-REFERENCE TO RELATED APPLICATION

This application claims priority from Korean Patent Application No. 10-2022-0136329 filed on Oct. 21, 2022, in the Korean Intellectual Property Office, and all the benefits accruing therefrom under 35 U.S.C. 119, the contents of which in its entirety are herein incorporated by reference.

BACKGROUND

1. Field

Embodiments relate to a semiconductor device.

2. Description of the Related Art

As one of scaling technologies for increasing density of semiconductor devices, a multi gate transistor in which a multi-channel active pattern (or a silicon body) having a fin or nanowire shape is formed on a substrate and a gate is formed on a surface of the multi-channel active pattern has been considered.

SUMMARY

The embodiments may be realized by providing a semiconductor device including a substrate including a first region and a second region; a first active pattern on the first region of the substrate, the first active pattern including a first lower pattern extending in a first direction, and a plurality of first sheet patterns spaced apart from the first lower pattern in a vertical direction; a second active pattern on the second region of the substrate, the second active pattern including a second lower pattern extending in the first direction, a height of the second lower pattern in the vertical direction being identical to a height of the first lower pattern in the vertical direction, and a plurality of second sheet patterns spaced apart from the second lower pattern in the vertical direction; a first gate structure on the first lower pattern, the first gate structure including a first gate insulating film and a first gate electrode extending in a second direction that crosses the first direction; a second gate structure on the second lower pattern, the second gate structure including a second gate insulating film, and a second gate electrode extending in the second direction, a width of the second gate electrode in the first direction being greater than a width of the first gate electrode in the first direction; a first source/drain pattern on the first lower pattern, the first source/drain pattern being connected to the plurality of first sheet patterns; and a second source/drain pattern on the second lower pattern, the second source/drain pattern being connected to the plurality of second sheet patterns, wherein a number of first sheet patterns in the plurality of first sheet patterns is smaller than a number of second sheet patterns in the plurality of second sheet patterns.

The embodiments may be realized by providing a semiconductor device including a substrate including a first region and a second region; a first active pattern on the first region of the substrate, the first active pattern including a first lower pattern extending in a first direction, and a plurality of first sheet patterns spaced apart from the first lower pattern in a vertical direction; a second active pattern on the second region of the substrate, the second active pattern including a second lower pattern extending in the first direction, and a plurality of second sheet patterns spaced apart from the second lower pattern in the vertical direction; a first gate structure on the first lower pattern, the first gate structure including a first gate insulating film and a first gate electrode extending in a second direction that crosses the first direction; a second gate structure on the second lower pattern, the second gate structure including a second gate insulating film, and a second gate electrode extending in the second direction, a width of the second gate electrode in the first direction being different from a width of the first gate electrode in the first direction; a first source/drain pattern on the first lower pattern, the first source/drain pattern being connected to a plurality of the first sheet patterns; and a second source/drain pattern on the second lower pattern, the second source/drain pattern being connected to a plurality of the second sheet patterns, wherein a number of first sheet patterns in the plurality of first sheet patterns is smaller than a number of the second sheet patterns in the plurality of second sheet patterns, the plurality of first sheet patterns includes a first uppermost sheet pattern, the plurality of second sheet patterns includes a second uppermost sheet pattern, and a height from an upper surface of the first uppermost sheet pattern to an upper surface of the first gate electrode in the vertical direction is greater than a height from an upper surface of the second uppermost sheet pattern to an upper surface of the second gate electrode in the vertical direction.

The embodiments may be realized by providing a semiconductor device including a substrate including a SRAM region and an I/O region; a first active pattern on the SRAM region of the substrate, the first active pattern including a first lower pattern extending in a first direction, and a plurality of first sheet patterns spaced apart from the first lower pattern in a vertical direction; a second active pattern on the I/O region of the substrate, the second active pattern including a second lower pattern extending in the first direction, and a plurality of second sheet patterns spaced apart from the second lower pattern in the vertical direction; a first gate structure on the first lower pattern, the first gate structure including a first gate insulating film and a first gate electrode extending in a second direction that crosses the first direction; a second gate structure on the second lower pattern, the second gate structure including a second gate insulating film and a second gate electrode extending in the second direction; a first source/drain pattern on the first lower pattern, the first source/drain pattern being connected to the plurality of first sheet patterns; and a second source/drain pattern on the second lower pattern, the second source/drain pattern being connected to the plurality of second sheet patterns, wherein a number of first sheet patterns in the plurality of first sheet patterns is smaller than a number of second sheet patterns in the plurality of second sheet patterns, the plurality of first sheet patterns includes a first uppermost sheet pattern, the plurality of second sheet patterns includes a second uppermost sheet pattern, and a thickness of the first gate insulating film on an upper surface of the first uppermost sheet pattern in the vertical direction is smaller than a thickness of the second gate insulating film on an upper surface of the second uppermost sheet pattern in the vertical direction.

BRIEF DESCRIPTION OF THE DRAWINGS

Features will be apparent to those of skill in the art by describing in detail exemplary embodiments with reference to the attached drawings in which.

DETAILED DESCRIPTION

Terms such as first and second are used to describe various elements or components in the present specification. These terms are only used to distinguish a single element or component from other elements or components, e.g., are not intended to imply or require sequential inclusion.

Although drawings of a semiconductor device according to some embodiments show a fin-type transistor (FinFET) including a channel region of a fin-type pattern shape, a transistor including a nanowire or a nanosheet, and a MBCFET™ (Multi-Bridge Channel Field Effect Transistor) as an example. The semiconductor device according to some embodiments may, of course, include a tunneling transistor (tunneling FET), a three-dimensional (3D) transistor or a vertical transistor (Vertical FET). The semiconductor device according to some embodiments may, of course, include a planar transistor. In addition, the embodiments may be applied to a transistor based on two-dimensional material (2D material based FETs) and a heterostructure thereof.

Further, the semiconductor device according to some embodiments may also include a bipolar junction transistor, a laterally diffused metal oxide semiconductor (LDMOS), or the like.

The semiconductor device according to some embodiments will be described referring to FIGS. 1 to 6.

Figure 1:
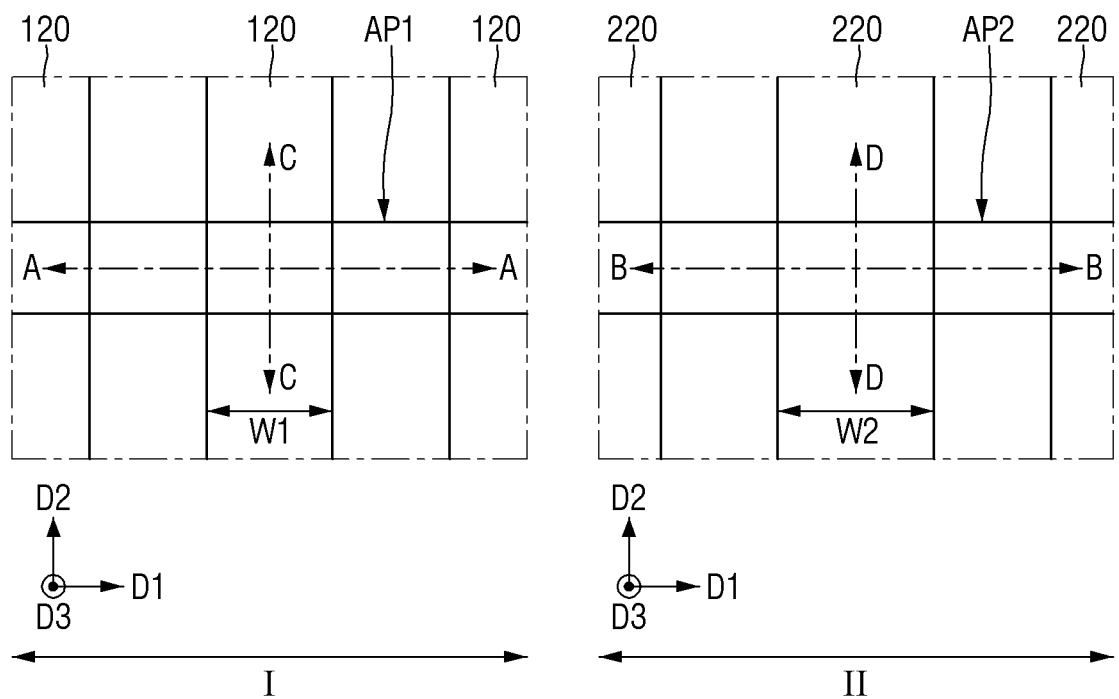
FIG. 1 is an example plan view for explaining the semiconductor device according to some embodiments.
Figure 2:
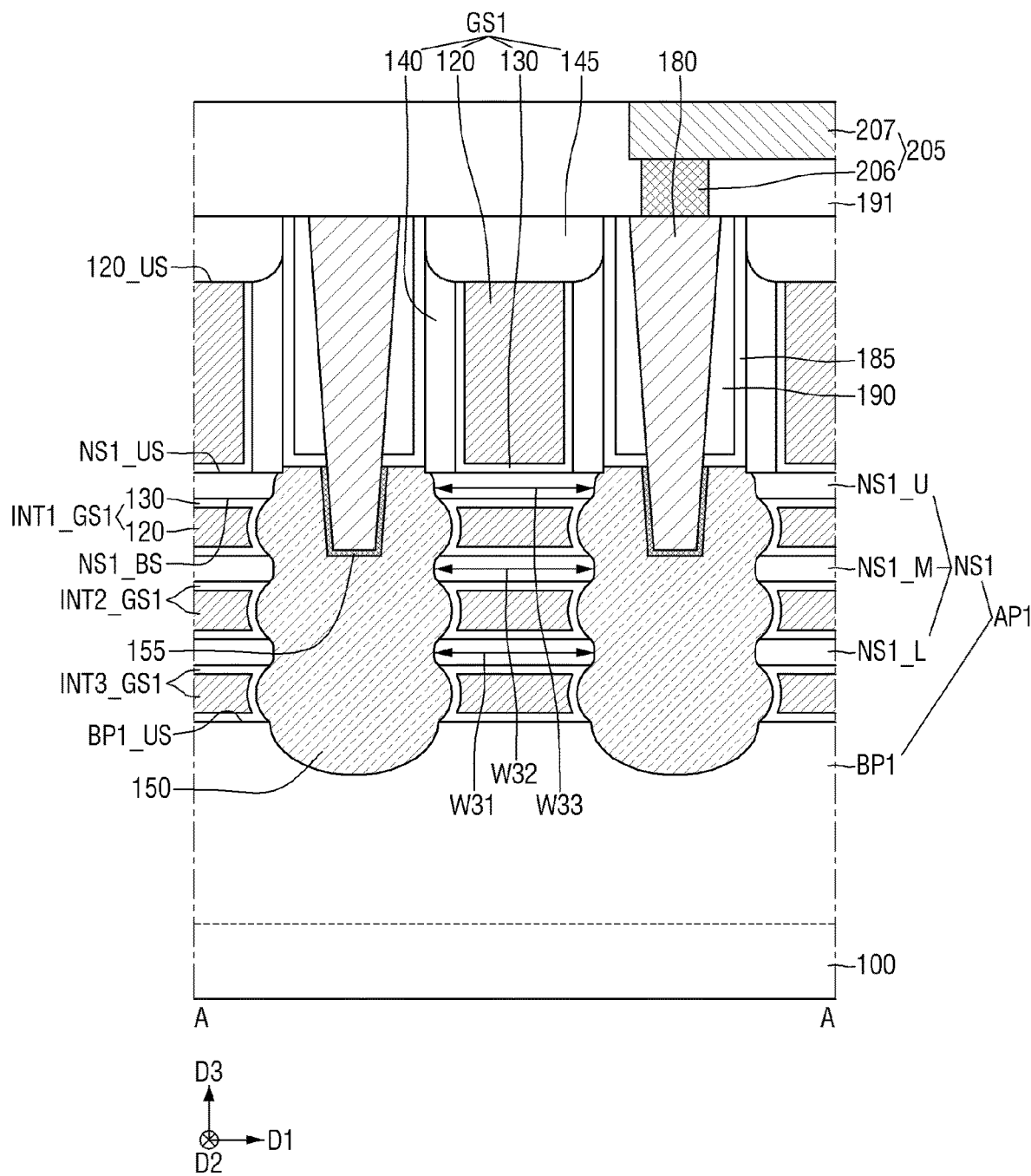
FIG. 2 is a cross-sectional view taken along a line A-A of FIG. 1.
Figure 3:
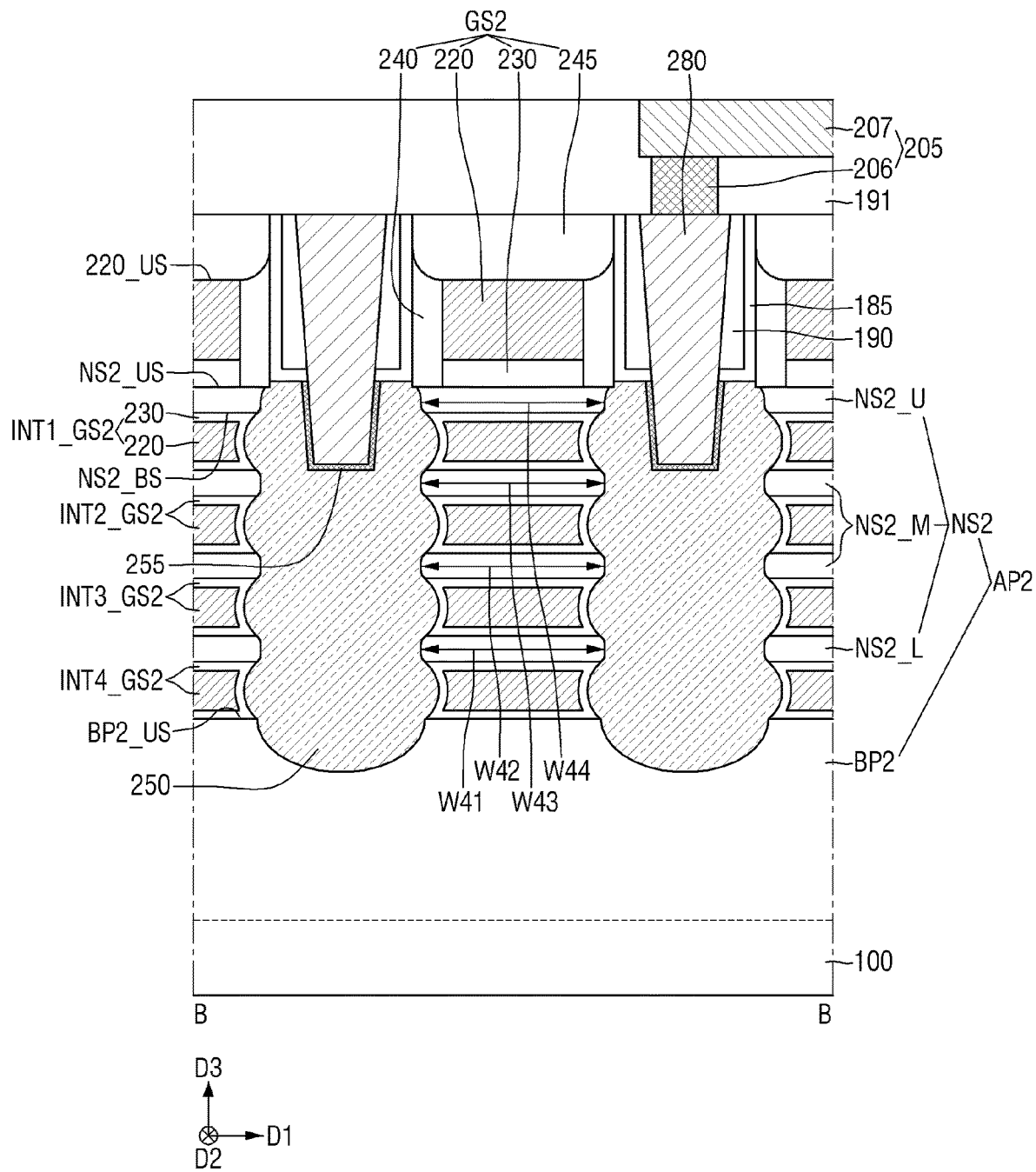
FIG. 3 is a cross-sectional view taken along a line B-B of FIG. 1.
Figure 4:
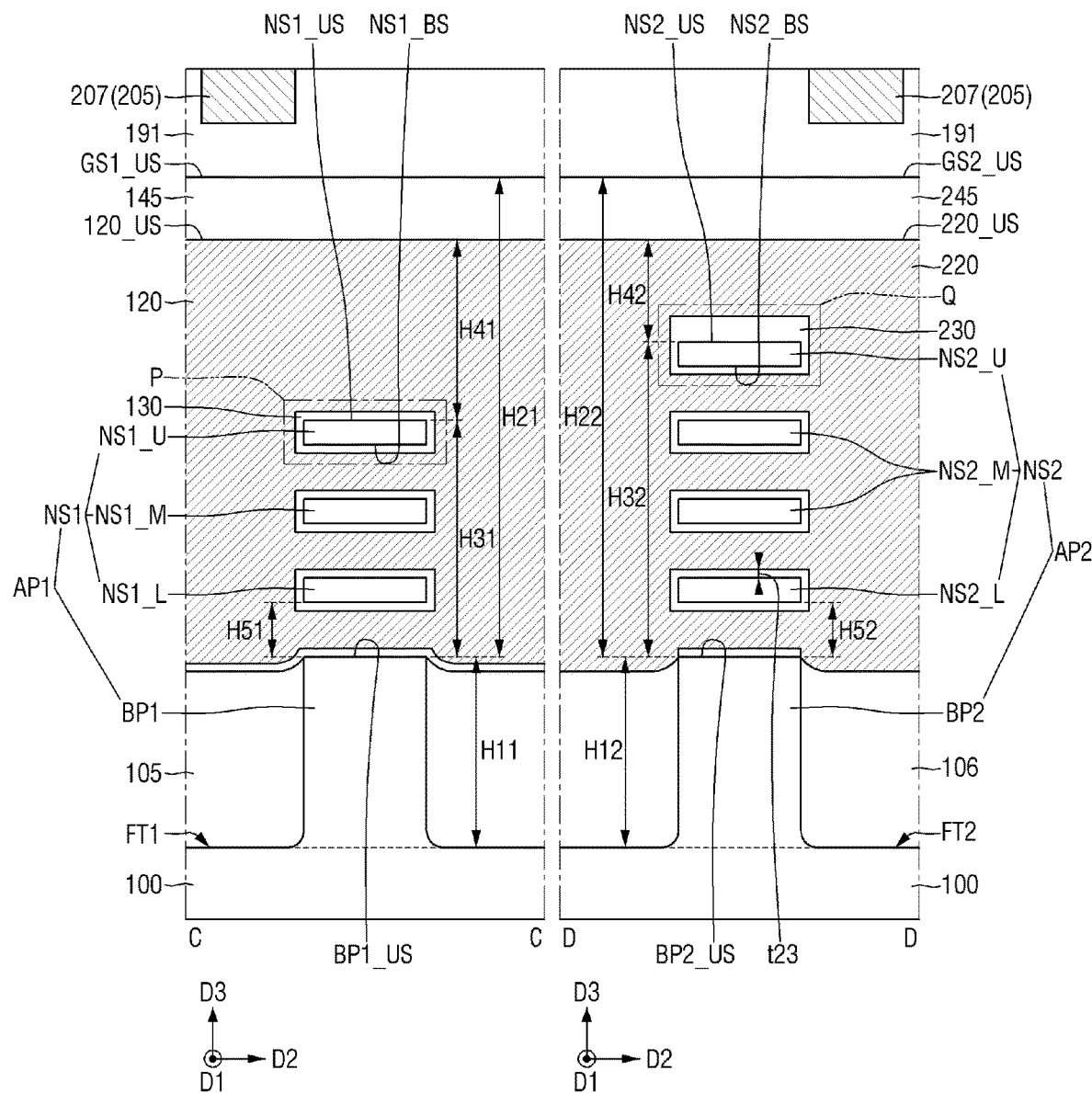
FIG. 4 is a cross-sectional view taken along lines C-C and D-D of FIG. 1.
Figure 5:
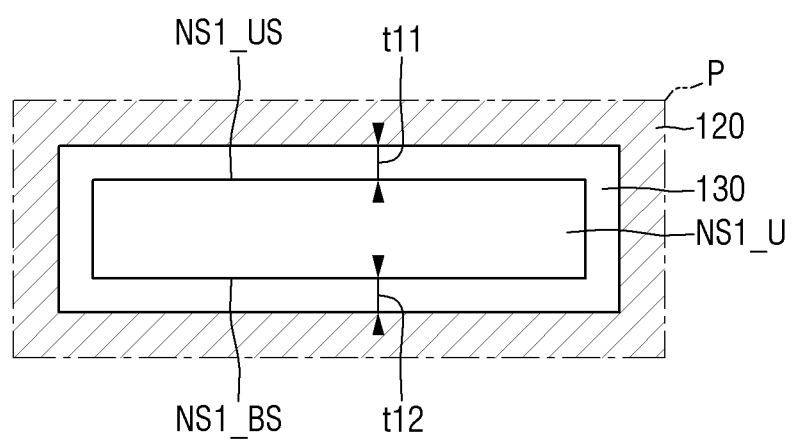
FIG. 5 is an enlarged view showing a portion P of FIG. 4.
Figure 6:
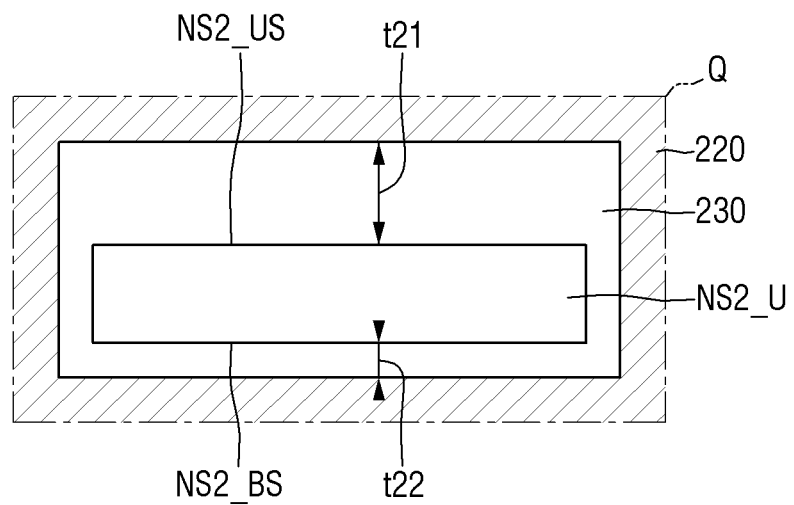
FIG. 6 is an enlarged view of a portion Q of FIG. 4.

FIG. 1 is an example plan view for explaining the semiconductor device according to some embodiments. FIG. 2 is a cross-sectional view taken along a line A-A of FIG. 1. FIG. 3 is a cross-sectional view taken along a line B-B of FIG. 1. FIG. 4 is a cross-sectional view taken along lines C-C and D-D of FIG. 1. FIG. 5 is an enlarged view showing a portion P of FIG. 4. FIG. 6 is an enlarged view of a portion Q of FIG. 4.

Referring to FIGS. 1 to 6, a semiconductor device according to some embodiments may include a first active pattern AP1, a plurality of first gate electrodes 120, a first source/drain pattern 150, a second active pattern AP2, a plurality of second gate electrodes 220, and a second source/drain pattern 250.

The substrate 100 may include a first region I and a second region II. In the semiconductor device according to some embodiments, the first region I may be a logic region or an SRAM region, and the second region II may be an I/O region.

In an implementation, the first region I and the second region II may be regions in which transistors of the same conductivity type are formed. In an implementation, the first region I and the second region II may be regions in which transistors of different conductivity types are formed.

The substrate 100 may be a bulk silicon or a silicon on insulator (SOI). In an implementation, the substrate 100 may be a silicon substrate, or may include, e.g., silicon germanium, silicon germanium on insulator (SGOI), indium antimonide, lead tellurium compounds, indium arsenic, indium phosphate, gallium arsenide, or antimonide gallium. As used herein, the term "or" is not an exclusive term, e.g., "A or B" would include A, B, or A and B.

The first active pattern AP1, the plurality of first gate electrodes 120, and the first source/drain pattern 150 may be on the first region I of the substrate 100. The second active pattern AP2, the plurality of second gate electrodes 220, and the second source/drain pattern 250 may be on the second region II of the substrate 100.

The first active pattern AP1 and the second active pattern AP2 may be on the substrate 100, respectively. Each of the first active pattern AP1 and the second active pattern AP2 may extend (e.g., lengthwise) in the first direction D1.

In an implementation, one of the first active pattern AP1 and the second active pattern AP2 may extend in a first direction D1, and the other may extend in a second direction D2. In the following description, the first active pattern AP1 and the second active pattern AP2 will be described to extend in the first direction D1.

Each of the first active pattern AP1 and the second active pattern AP2 may be multi-channel active patterns. In the semiconductor device according to some embodiments, the first active pattern AP1 may include a first lower pattern BP1 and a plurality of first sheet patterns NS1. The second active pattern AP2 may include a second lower pattern BP2 and a plurality of second sheet patterns NS2.

The first lower pattern BP1 may protrude from the substrate 100. The first lower pattern BP1 may extend lengthwise in the first direction D1. The first lower pattern BP1 may be defined by a first fin trench FT1. The first fin trench FT1 may extend in the first direction D1.

The second lower pattern BP2 may protrude from the substrate 100. The second lower pattern BP2 may extend lengthwise in the first direction D1. The second lower pattern BP2 may be defined by the second fin trench FT2. The second fin trench FT2 may extend in the first direction D1.

A height H11 (e.g., in a vertical third direction D3) of the first lower pattern BP1 may be the same as a height H12 of the second lower pattern BP2. The height H11 from a bottom surface of the first fin trench FT1 to an upper surface BP1_US of the first lower pattern may be the same as a height H12 from the bottom surface of the second fin trench FT2 to an upper surface BP2_US of the second lower pattern.

A plurality of first sheet patterns NS1 may be on the upper surface BP1_US of the first lower pattern. The plurality of first sheet patterns NS1 may be spaced apart from the first lower pattern BP1 in the third direction D3. Each first sheet pattern NS1 may be spaced apart from each other in the third direction D3.

The first sheet pattern NS1 may include a first lowermost sheet pattern NS1_L and a first uppermost sheet pattern NS1_U. The first sheet pattern NS1 may include at least one first intermediate sheet pattern NS1_M between the first lowermost sheet pattern NS1_L and the first uppermost sheet pattern NS1_U.

Each first sheet pattern NS1 may include an upper surface NS1_US and a lower surface NS1_BS. The upper surface NS1_US of the first sheet pattern is a surface that is opposite to the lower surface NS1_BS of the first sheet pattern in the third direction D3. The lower surface NS1_BS of the first sheet pattern faces the upper surface BP1_US of the first lower pattern.

The third direction D3 may be a direction that intersects the first direction D1 and the second direction D2. In an implementation, the third direction D3 may be a thickness direction of the substrate 100. The first direction D1 may be a direction that intersects the second direction D2.

A plurality of second sheet patterns NS2 may be on the upper surface BP2_US of the second lower pattern. The plurality of second sheet patterns NS2 may be spaced apart from the second lower pattern BP2 in the third direction D3. Each second sheet pattern NS2 may be spaced apart from each other in the third direction D3.

The second sheet pattern NS2 may include a second lowermost sheet pattern NS2_L and a second uppermost sheet pattern NS2_U. The second sheet pattern NS2 may include at least one second intermediate sheet pattern NS2_M between the second lowermost sheet pattern NS2_L and the second uppermost sheet pattern NS2_U.

Each second sheet pattern NS2 may include an upper surface NS2_US and a lower surface NS2_BS. The upper surface NS2_US of the second sheet pattern is a surface that is opposite to the lower surface NS2_BS of the second sheet pattern in the third direction D3. The lower surface NS2_BS of the second sheet pattern faces the upper surface BP2_US of the second lower pattern.

A number of first sheet patterns NS1 may be smaller than a number of second sheet patterns NS2. In an implementation, the number of first sheet patterns NS1 included in the first active pattern AP1 on the logic region and the SRAM region may be smaller than the number of second sheet patterns NS1 included in the second active pattern AP2 on the I/O region.

In an implementation, the number of first intermediate sheet patterns NS1_M may be smaller than the number of second intermediate sheet patterns NS2_M. In an implementation, the first sheet pattern NS1 may not include the intermediate sheet pattern, and the second sheet pattern NS2 may include the second intermediate sheet pattern NS2_M.

In an implementation, as illustrated in the drawings, the first sheet pattern NS1 may include one first intermediate sheet pattern NS1_M and the second sheet pattern NS2 may include two second intermediate sheet patterns NS2_M.

A height H51 from the upper surface BP1_US of the first lower pattern to the lower surface NS1_BS of the first lowermost sheet pattern may be the same as a height H52 from the upper surface BP2_US of the second lower pattern to the lower surface NS2_BS of the second lowermost sheet pattern. In an implementation, the bottom surface of the first fin trench FT1 and the bottom surface of the second fin trench FT2 may be an upper side of the substrate 100, and the first lowermost sheet pattern NS1_L and the second lowermost sheet pattern NS2_L may be at the same height level on the basis of the upper side of the substrate 100.

A height H31 from the upper surface BP1_US of the first lower pattern to the upper surface NS1_US of the first uppermost sheet pattern may be smaller than a height H32 from the upper surface BP2_US of the second lower pattern to the upper surface NS2_US of the second uppermost sheet pattern. The first uppermost sheet pattern NS1_U and the second uppermost sheet pattern NS2_U may be at different height levels on the basis of the upper side of the substrate 100.

Each of the first lower pattern BP1 and the second lower pattern BP2 may be formed by etching a part of the substrate 100, and may include an epitaxial layer grown from the substrate 100. The first lower pattern BP1 and the second lower pattern BP2 may each include silicon or germanium, which is an elemental semiconductor material. In an implementation, the first lower pattern BP1 and the second lower pattern BP2 each may include a compound semiconductor, and may include, e.g., a group Iv-Iv compound semiconductor or a group III-V compound semiconductor.

The group IV-IV compound semiconductor may be, e.g., a binary compound or a ternary compound including at least two or more of carbon (C), silicon (Si), germanium (Ge), and tin (Sn), or a compound obtained by doping these elements with a group IV element.

The group III-V compound semiconductor may be, e.g., a binary compound, a ternary compound, or a quaternary compound formed by combining aluminum (Al), gallium (Ga) or indium (In) as a group III element with phosphorus (P), arsenic (As) or antimony (Sb) as a group V element.

The first sheet pattern NS1 and the second sheet pattern NS2 may each include silicon or germanium which is an elemental semiconductor material, a group Iv-Iv compound semiconductor or a group III-V compound semiconductor. Each first sheet pattern NS1 may include the same material as the first lower pattern BP1, and may include a different material from the first lower pattern BP1. Each second sheet pattern NS2 may include the same material as the second lower pattern BP2, and may include a different material from the second lower pattern BP2.

In the semiconductor device according to some embodiments, each of the first lower pattern BP1 and the second lower pattern BP2 may be a silicon lower pattern including silicon, and the first sheet pattern NS1 and the second sheet pattern NS2 may each be silicon sheet pattern including silicon.

A width W31 of the first lowermost sheet pattern NS1_L in the first direction D1 may be the same as a width W32 of the first intermediate sheet pattern NS1_M in the first direction D1. A width W33 of the first uppermost sheet pattern NS1_U in the first direction D1 may be the same as the width W32 of the first intermediate sheet pattern NS1_M in the first direction D1.

In an implementation, the width W33 of the first uppermost sheet pattern NS1_U in the first direction D1 may be greater than the width W32 of the first intermediate sheet pattern NS1_M in the first direction D1. In the etching process for forming the first source/drain pattern 150, a portion in which the first uppermost sheet pattern NS1_U is disposed may be less etched than a portion in which the first intermediate sheet pattern NS1_M is disposed.

A width W41 of the second lowermost sheet pattern NS2_L in the first direction D1 may be the same as widths W42 and W43 of the second intermediate sheet pattern NS2_M in the first direction D1. A width W44 of the second uppermost sheet pattern NS2_U in the first direction D1 may be the same as the widths W42 and W43 of the second intermediate sheet pattern NS2_M in the first direction D1.

In an implementation, the width W44 of the second uppermost sheet pattern NS2_U in the first direction D1 may be greater than the width W42 and W43 of the second intermediate sheet pattern NS2_M in the first direction D1. In the etching process for forming the second source/drain pattern 250, a portion in which the second uppermost sheet pattern NS2_U is disposed may be less etched than a portion in which the second intermediate sheet pattern NS2_M is disposed.

The first lowermost sheet pattern NS1_L will be described as an example. The width W31 of the first lowermost sheet pattern NS1_L in the first direction D1 may be measured halfway between the upper surface NS1_US of the first lowermost sheet pattern and the lower surface NS1_BS of the first lowermost sheet pattern that are opposite to each other in the third direction D3.

The width of the first sheet pattern NS1 in the second direction D2 may increase or decrease in proportion to the width of the upper surface BP1_US of the first lower pattern in the second direction D2. The width of the second sheet pattern NS2 in the second direction D2 may increase or decrease in proportion to the width of the upper surface BP2_US of the second lower pattern in the second direction D2.

In an implementation, as illustrated in the drawings, the first sheet patterns NS1 stacked in the third direction D3 may have the same width in the second direction D2, and the second sheet patterns NS2 stacked in the third direction D3 may have the same width in the second direction D2. In an implementation, the width in the second direction D2 of the first sheet patterns NS1 stacked in the third direction D3 may decrease as it goes away from the first lower pattern BP1. In an implementation, the above description is also applicable to the second active pattern AP2.

In an implementation, as illustrated in FIG. 1, the width of the first active pattern AP1 in the second direction D2 may be identical to the width of the second active pattern AP2 in the second direction D2. In an implementation, the width of the first active pattern AP1 in the second direction D2 may be the width of the upper surface BP1_US of the first lower pattern in the second direction D2.

A first field insulating film 105 may be on the substrate 100. The first field insulating film 105 may be on the side wall of the first lower pattern BP1. The first field insulating film 105 may fill the first fin trench FT1. The first field insulating film 105 may not be on the upper surface BP1_US of the first lower pattern.

A second field insulating film 106 may be on the substrate 100. The second field insulating film 106 may be on the side wall of the second lower pattern BP2. The second field insulating film 106 may fill the second fin trench FT2. The second field insulating film 106 may not be on the upper surface BP2_US of the second lower pattern.

In an implementation, the field insulating films 105 and 106 may entirely cover the side walls of the lower patterns BP1 and BP2. In an implementation, the field insulating films 105 and 106 may partially cover the side walls of the lower patterns BP1 and BP2. In an implementation, a part of the lower patterns BP1 and BP2 may protrude beyond or above the upper surfaces of the field insulating films 105 and 106 in the third direction D3.

The field insulating films 105 and 106 may include, e.g., an oxide film, a nitride film, an oxynitride film or combinations thereof. In an implementation, as illustrated in the drawings, the field insulating films 105 and 106 may be single films or multilayer films.

A plurality of first gate structures GS1 may be on the substrate 100. Each first gate structure GS1 may extend in the second direction D2. The first gate structures GS1 may be spaced apart in the first direction D1. The first gate structures GS1 may be adjacent to each other in the first direction D1. In an implementation, the first gate structures GS1 may be on both sides of the first source/drain pattern 150 in the first direction D1.

The first gate structure GS1 may be on the first active pattern AP1. The first gate structure GS1 may intersect the first active pattern AP1. The first gate structure GS1 may intersect the first lower pattern BP1. The first gate structure GS1 may wrap the respective first sheet patterns NS1.

The first gate structure GS1 may include, e.g., a first gate electrode 120, a first gate insulating film 130, a first gate spacer 140, and a first gate capping pattern 145.

The first gate structures GS1 may include a plurality of inner gate structures INT1_GS1, INT2_GS1, and INT3_GS1 between the first sheet patterns NS1 adjacent in the third direction D3, and between the first lower pattern BP1 and the first sheet pattern NS1. The first inner gate structures INT1_GS1, INT2_GS1, and INT3_GS1 may be between the upper surface BP1_US of the first lower pattern and the lower surface NS1_BS of the first lowermost sheet pattern, and between the upper surface NS1_US of the first sheet pattern and the lower surface NS1_BS of the first sheet pattern that face each other in the third direction D3.

A number of first inner gate structures INT1_GS1, INT2_GS1, and INT3_GS1 may be the same as the number of first sheet patterns NS1. In an implementation, the first gate structure GS1 may include three first inner gate structures INT1_GS1, INT2_GS1, and INT3_GS1.

The first inner gate structures INT1_GS1, INT2_GS1, and INT3_GS1 may be in (e.g., direct) contact with the upper surface BP1_US of the first lower pattern, the upper surface NS1_US of the first sheet pattern, and the lower surface NS1_BS of the first sheet pattern. In the semiconductor device according to some embodiments, the first inner gate structures INT1_GS1, INT2_GS1, and INT3_GS1 may be in contact with a first source/drain pattern 150, which will be described below.

The first inner gate structures INT1_GS1, INT2_GS1, and INT3_GS1 include the first gate electrode 120 and the first gate insulating film 130 which are between adjacent first sheet patterns NS1, and between the first lower pattern BP1 and the first sheet pattern NS1.

A plurality of second gate structures GS2 may be on the substrate 100. Each second gate structure GS2 may extend in the second direction D2. The second gate structures GS2 may be spaced apart in the first direction D1. The second gate structures GS2 may be adjacent to each other in the first direction D1. In an implementation, the second gate structures GS2 may be on both sides of the second source/drain patterns 250 in the first direction D1.

The second gate structure GS2 may be on the second active pattern AP2. The second gate structure GS2 may intersect the second active pattern AP2. The second gate structure GS2 may intersect the second lower pattern BP2. The second gate structure GS2 may wrap the respective second sheet patterns NS2.

The second gate structure GS2 may include, e.g., a second gate electrode 220, a second gate insulating film 230, a second gate spacer 240, and a second gate capping pattern 245.

The second gate structure GS2 may include a plurality of second inner gate structures INT1_GS2, INT2_GS2, INT3_GS2, and INT4_GS2 which are between the second sheet patterns NS2 adjacent in the third direction D3, and between the second lower pattern BP2 and the second sheet pattern NS2. The second inner gate structures INT1_GS2, INT2_GS2, INT3_GS2, and INT4_GS2 may be between the upper surface BP2_US of the second lower pattern and the lower surface NS2_BS of the second lowermost sheet pattern, and between the upper surface NS2_US of the second sheet pattern and the lower surface NS2_BS of the second sheet pattern that face each other in the third direction D3. In an implementation, the second gate structure GS2 may include four second inner gate structures INT1_GS2, INT2_GS2, INT3_GS2, and INT4_GS2.

The second inner gate structures INT1_GS2, INT2_GS2, INT3_GS2, and INT4_GS2 may be in contact with the upper surface BP2_US of the second lower pattern, the upper surface NS2_US of the second sheet pattern, and the lower surface NS2_BS of the second sheet pattern. In the semiconductor device according to some embodiments, the second inner gate structures INT1_GS2, INT2_GS2, INT3_GS2, and INT4_GS2 may be in contact with a second source/drain pattern 250, which will be described below.

The second inner gate structures INT1_GS2, INT2_GS2, INT3_GS2, and INT4_GS2 include a second gate electrode 220 and a second gate insulating film 230 which are between the adjacent second sheet patterns NS2, and between the second lower pattern BP2 and the second sheet pattern NS2.

When the first active pattern AP1 and the second active pattern AP2 extend in different directions from each other, an extending direction of the second gate structure GS2 may be different from an extending direction of the first gate structure GS1.

The first gate electrode 120 may be on the first lower pattern BP1. The first gate electrode 120 may intersect the first lower pattern BP1. The first gate electrode 120 may wrap the first sheet pattern NS1. The first gate electrode 120 may include a side wall that faces the first gate spacer 140.

A second gate electrode 220 may be on the second lower pattern BP2. The second gate electrode 220 may intersect the second lower pattern BP2. The second gate electrode 220 may wrap the second sheet pattern NS2. The second gate electrode 220 may include a side wall that faces the second gate spacer 240.

A width W1 of the first gate electrode 120 in the first direction D1 may be different from a width W2 of the second gate electrode 220 in the first direction D1. In an implementation, the width W1 of the first gate electrode 120 in the first direction D1 may be smaller than the width W2 of the second gate electrode 220 in the first direction D1.

A height H41 from the upper surface NS1_US of the first uppermost sheet pattern to the upper surface 120_US of the first gate electrode may be greater than a height H42 from the upper surface NS2_US of the second uppermost sheet pattern to the upper surface 220_US of the second gate electrode.

A height (H31+H41) from the upper surface BP1_US of the first lower pattern to the upper surface 120_US of the first gate electrode may be the same as a height (H32+H42) from the upper surface BP2_US of the second lower pattern to the upper surface 220_US of the second gate electrode.

In an implementation, as illustrated in FIGS. 2 and 3, the upper surface 120_US of the first gate electrode and the second gate electrode 220_US may be concave curved surfaces. In an implementation, the upper surface 120_US of the first gate electrode and the second gate electrode 220_US may be a flat surface.

The first gate electrode 120 and the second gate electrode 220 may each include a metal (e.g., non-compounded metal), a metal alloy, a conductive metal nitride, a metal silicide, a doped semiconductor material, a conductive metal oxide, or a conductive metal oxynitride. Each of the first gate electrode 120 and the second gate electrode 220 may include, e.g., titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlCN), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (NiPt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), or combinations thereof. The conductive metal oxide and the conductive metal oxynitride may include, e.g., an oxidized form of the above-mentioned materials.

The first gate electrode 120 may be on both sides of a first source/drain pattern 150 to be described below. The first gate structure GS1 may be on both sides of the first source/drain pattern 150 in the first direction D1.

In an implementation, the first gate electrodes 120 on both sides of the first source/drain pattern 150 may be normal gate electrodes used as gates of the transistor. In an implementation, the first gate electrode 120 on one side of the first source/drain pattern 150 may be used as the gate of the transistor, and the first gate electrode 120 on the other side of the first source/drain pattern 150 may be a dummy gate electrode.

The second gate electrode 220 may be on both sides of a second source/drain pattern 250 to be described below. The second gate structure GS2 may be on both sides of the second source/drain pattern 250 in the first direction D1.

In an implementation, the second gate electrodes 220 on both sides of the second source/drain pattern 250 may be normal gate electrodes used as gates of the transistor. In an implementation, the second gate electrode 220 on one side of the second source/drain pattern 250 is used as the gate of the transistor, but the second gate electrode 220 on the other side of the second source/drain pattern 250 may be a dummy gate electrode.

The first gate insulating film 130 may extend along the upper surface of the first field insulating film 105 and the upper surface BP1_US of the first lower pattern. The first gate insulating film 130 may extend along side walls of the first gate electrode 120.

The first gate insulating film 130 may wrap the plurality of first sheet patterns NS1. The first gate insulating film 130 may be along the periphery of the first sheet pattern NS1. The first gate electrode 120 may be on the first gate insulating film 130. The first gate insulating film 130 may be between the first gate electrode 120 and the first sheet pattern NS1.

The first gate insulating film 130 may include a high dielectric constant material having a higher dielectric constant than silicon oxide. The first gate insulating film 130 may include, e.g., boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate.

The second gate insulating film 230 may extend along the upper surface BP2_US of the second lower pattern. The second gate insulating film 230 may not extend along the upper surface of the second field insulating film 106. The second gate insulating film 230 may not extend along the side walls of the second gate electrode 220.

The second gate insulating film 230 may wrap the plurality of second sheet patterns NS2. The second gate insulating film 230 may be along the periphery of the second sheet pattern NS2. The second gate electrode 220 may be on the second gate insulating film 230. The second gate insulating film 230 may be between the second gate electrode 220 and the second sheet pattern NS2.

The second gate insulating film 230 may include, e.g., silicon oxide. In the semiconductor device according to some embodiments, the second gate insulating film 230 may include a material different from the first gate insulating film 130. In an implementation, the dielectric constant of the first gate insulating film 130 may be greater than the dielectric constant of the second gate insulating film 230.

A thickness t11 (e.g., in the third direction D3) of the first gate insulating film 130 on the upper surface NS1_US of the first uppermost sheet pattern may be the same as a thickness t12 of the first gate insulating film 130 on the lower surface NS1_BS of the first uppermost sheet pattern. Here, the term "same thickness" means not only a case where the thicknesses are exactly the same at two positions to be compared, but also a minute difference in thickness that may occur due to a process margin or the like.

A thickness t21 of the second gate insulating film 230 on the upper surface NS2_US of the second uppermost sheet pattern may be greater than a thickness t22 of the second gate insulating film 230 on the lower surface NS2_BS of the second uppermost sheet pattern. The thickness t21 of the second gate insulating film 230 on the upper surface NS2_US of the second uppermost sheet pattern may be greater than a thickness t23 of the second gate insulating film 230 on the upper surface NS2_US of the second lowermost sheet pattern.

The thickness t11 of the first gate insulating film 130 on the upper surface NS1_US of the first uppermost sheet pattern may be smaller than the thickness t21 of the second gate insulating film 230 on the upper surface NS2_US of the second uppermost sheet pattern.

The semiconductor device according to some embodiments may include an NC (Negative Capacitance) FET that uses a negative capacitor. In an implementation, the first gate insulating film 130 may include a ferroelectric material film having ferroelectric properties. In an implementation, the first gate insulating film 130 may include a ferroelectric material film having ferroelectric properties and a paraelectric material film having paraelectric properties.

The ferroelectric material film may have a negative capacitance, and the paraelectric material film may have a positive capacitance. In an implementation, if two or more capacitors are connected in series and the capacitance of each capacitor has a positive value, the overall capacitances decrease from the capacitance of each of the individual capacitors. In an implementation, if at least one of the capacitances of two or more capacitors connected in series has a negative value, the overall capacitances may be greater than an absolute value of each of the individual capacitances, while having a positive value.

When the ferroelectric material film having the negative capacitance and the paraelectric material film having the positive capacitance are connected in series, the overall capacitance values of the ferroelectric material film and the paraelectric material film connected in series may increase. By the use of the increased overall capacitance value, a transistor including the ferroelectric material film may have a subthreshold swing (SS) under 60 mV/decade at room temperature.

The ferroelectric material film may have ferroelectric properties. The ferroelectric material film may include, e.g., hafnium oxide, hafnium zirconium oxide, barium strontium titanium oxide, barium titanium oxide, or lead zirconium titanium oxide. In an implementation, the hafnium zirconium oxide may be a material obtained by doping hafnium oxide with zirconium (Zr). In an implementation, the hafnium zirconium oxide may be a compound of hafnium (Hf), zirconium (Zr), and oxygen (O).

The ferroelectric material film may further include a doped dopant. In an implementation, the dopant may include, e.g., aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), or tin (Sn). The type of dopant included in the ferroelectric material film may vary, depending on which type of ferroelectric material is included in the ferroelectric material film.

When the ferroelectric material film includes hafnium oxide, the dopant included in the ferroelectric material film may include, e.g., gadolinium (Gd), silicon (Si), zirconium (Zr), aluminum (Al), or yttrium (Y).

When the dopant is aluminum (Al), the ferroelectric material film may include 3 to 8 at % (atomic %) aluminum. Here, a ratio of the dopant may be a ratio of aluminum to the sum of hafnium and aluminum.

When the dopant is silicon (Si), the ferroelectric material film may include 2 to 10 at % silicon. When the dopant is yttrium (Y), the ferroelectric material film may include 2 to 10 at % yttrium. When the dopant is gadolinium (Gd), the ferroelectric material film may include 1 to 7 at % gadolinium. When the dopant is zirconium (Zr), the ferroelectric material film may include 50 to 80 at % zirconium.

The paraelectric material film may have the paraelectric properties. The paraelectric material film may include, e.g., a silicon oxide and a metal oxide having a high dielectric constant. The metal oxide included in the paraelectric material film may include, e.g., hafnium oxide, zirconium oxide, or aluminum oxide.

The ferroelectric material film and the paraelectric material film may include the same material. The ferroelectric material film has the ferroelectric properties, but the paraelectric material film may not have the ferroelectric properties. In an implementation, when the ferroelectric material film and the paraelectric material film include hafnium oxide, a crystal structure of hafnium oxide included in the ferroelectric material film differs from a crystal structure of hafnium oxide included in the paraelectric material film.

The ferroelectric material film may have a thickness having the ferroelectric properties. A thickness of the ferroelectric material film may be, e.g., 0.5 to 10 nm. A critical thickness that exhibits the ferroelectric properties may vary for each ferroelectric material, and the thickness of the ferroelectric material film may vary depending on the ferroelectric material.

In an implementation, the first gate insulating film 130 may include one ferroelectric material film. In an implementation, the first gate insulating film 130 may each include a plurality of ferroelectric material films spaced apart from each other. The first gate insulating film 130 may have a stacked film structure in which the plurality of ferroelectric material films and the plurality of paraelectric material films are alternately stacked.

The first gate spacer 140 may be on the side walls of the first gate electrode 120. The first gate spacer 140 may not be between the first lower pattern BP1 and the first sheet pattern NS1, and between the first sheet patterns NS1 adjacent to each other in the third direction D3.

The second gate spacer 240 may be on the side wall of the second gate electrode 220. The second gate spacer 240 may not be between the second lower pattern BP2 and the second sheet pattern NS2, and between the second sheet patterns NS1 adjacent to each other in the third direction D3.

The first gate spacer 140 and the second gate spacer 240 may include, e.g., silicon nitride (SiN), silicon oxynitride (SiON), silicon oxide (SiO$_2$), silicon oxycarbonitride (SiOCN), silicon boronitride (SiBN), silicon oxyboronitride (SiOBN), silicon oxycarbide (SiOC), or combinations thereof. In an implementation, as illustrated in the drawings, the first gate spacer 140 and the second gate spacer 240 may each be a single film, or may be a multilayer film.

The first gate capping pattern 145 may be on the first gate electrode 120 and the first gate spacer 140. The second gate capping pattern 245 may be on the second gate electrode 220 and the second gate spacers 240. An upper surface of the first gate capping pattern 145 and an upper surface of the second gate capping pattern 245 may be on the same plane as an upper surface of the first interlayer insulating film 190.

The upper surface of the first gate capping pattern 145 may be an upper surface GS1_US of the first gate structure. The upper surface of the second gate capping pattern 245 may be an upper surface GS2_US of the second gate structure.

In an implementation, the first gate capping pattern 145 may be between the first gate spacers 140, and the second gate capping pattern 245 may be between the second gate spacers 240.

A height H21 from the upper surface BP1_US of the first lower pattern to the upper surface GS1_US of the first gate structure may be the same as a height H22 from the upper surface BP2_US of the second lower pattern to the upper surface GS2_US of the second gate structure.

The first gate capping pattern 145 and the second gate capping pattern 245 may each include, e.g., silicon nitride (SiN), silicon oxynitride (SiON), silicon carbonitride (SiCN), silicon oxycarbonitride (SiOCN), or combinations thereof. The first gate capping pattern 145 and the second gate capping pattern 245 may include a material having an etching selectivity with respect to the first interlayer insulating film 190.

The first source/drain pattern 150 may be on the first active pattern AP1. The first source/drain pattern 150 may be on the first lower pattern BP1. The first source/drain pattern 150 may be connected to the plurality of first sheet patterns NS1. The first source/drain pattern 150 may contact the first sheet pattern NS1.

The first source/drain pattern 150 may be on the side surfaces of the first gate structure GS1. The first source/drain pattern 150 may be between the first gate structures GS1 adjacent to each other in the first direction D1. In an implementation, the first source/drain pattern 150 may be on both sides of the first gate structure GS1. In an implementation, the first source/drain pattern 150 may be on one side of the first gate structure GS1 and may not be on the other side of the first gate structure GS1.

The second source/drain pattern 250 may be on the second active pattern AP2. The second source/drain pattern 250 may be on the second lower pattern BP2. The second source/drain pattern 250 may be connected to the plurality of second sheet patterns NS2. The second source/drain pattern 250 may contact the second sheet pattern NS2.

The second source/drain pattern 250 may be on the side surface of the second gate structure GS2. The second source/drain pattern 250 may be between the second gate structures GS2 adjacent to each other in the first direction D1. In an implementation, the second source/drain patterns 250 may be on both sides of the second gate structure GS2. In an implementation, the second source/drain pattern 250 may be on one side of the second gate structure GS2 and not on the other side of the second gate structure GS2.

The first source/drain pattern 150 and the second source/drain pattern 250 may be included in the source/drain of the transistor that uses the first sheet pattern NS1 and the second sheet pattern NS2 as channel regions.

In an implementation, as illustrated in the drawings, the first source/drain pattern 150 may include a plurality of width extension regions. In an implementation, as illustrated in the drawings, the second source/drain pattern 250 may include a plurality of width extension regions. Taking the first source/drain pattern 150 as an example, each width extension region may include a portion in which the width in the first direction D1 increases, and a portion in which the width in the first direction D1 decreases.

The first source/drain pattern 150 and the second source/drain pattern 250 may include an epitaxial pattern. The first source/drain pattern 150 and the second source/drain pattern 250 include a semiconductor material.

The first source/drain pattern 150 and the second source/drain pattern 250 may each include silicon or germanium which is an elemental semiconductor material. In an implementation, the first source/drain pattern 150 and the second source/drain pattern 250 may include, e.g., a binary compound or a ternary compound including at least two of carbon (C), silicon (Si), germanium (Ge), and tin (Sn), or a compound obtained by doping these elements with a group IV element. In an implementation, the first source/drain pattern 150 and the second source/drain pattern 250 may include, e.g., silicon, silicon-germanium, silicon carbide, or the like.

The first source/drain pattern 150 and the second source/drain pattern 250 may include impurities doped into the semiconductor material. In an implementation, the first source/drain pattern 150 and the second source/drain pattern 250 include, e.g., n-type impurities. The doped impurities may include, e.g., phosphorus (P), arsenic (As), antimony (Sb), or bismuth (Bi). In an implementation, the first source/drain pattern 150 and the second source/drain pattern 250 may include, e.g., p-type impurities. Doped impurities may include boron (B). In an implementation, one of the first source/drain pattern 150 and the second source/drain pattern 250 may include n-type impurities and the other may include p-type impurities.

In an implementation, as illustrated in the drawings, the first source/drain pattern 150 and the second source/drain pattern 250 may be single films.

A source/drain etching stop film 185 may be on the side walls of the first gate structure GS1, and the upper surface of the first source/drain pattern 150. The source/drain etching stop film 185 may be on the side walls of the second gate structure GS2, and the upper surface of the second source/drain pattern 250. In an implementation, the source/drain etching stop film 185 may be on the upper surfaces of the field insulating films 105 and 106.

The source/drain etching stop film 185 may include a material having an etching selectivity with respect to the first interlayer insulating film 190, which will be described below. The source/drain etching stop film 185 may include, e.g., silicon nitride (SiN), silicon oxynitride (SiON), silicon oxycarbonitride (SiOCN), silicon boronitride (SiBN), silicon oxyboronitride (SiOBN), silicon oxycarbide (SiOC), or combinations thereof.

The first interlayer insulating film 190 may be on the source/drain etching stop film 185. The first interlayer insulating film 190 may be on the first source/drain pattern 150 and the second source/drain pattern 250. The first interlayer insulating film 190 may not cover the upper surface GS1_US of the first gate structure and the upper surface GS2_US of the second gate structure.

The first interlayer insulating film 190 may include, e.g., silicon oxide, silicon nitride, silicon oxynitride, or a low dielectric constant material. The low dielectric constant material may include, e.g., Fluorinated TetraEthylOrthoSilicate (FTEOS), Hydrogen SilsesQuioxane (HSQ), Bis-benzoCycloButene (BCB), TetraMethylOrthoSilicate (TMOS), OctaMethyleyCloTetraSiloxane (OMCTS), HexaMethylDiSiloxane (HMDS), TriMethyl Silyl Borate (TMSB), DiAcetoxyDitertiaryButoSiloxane (DADBS), TriMethylSilil Phosphate (TMSP), PolyTetraFluoroEthylene (PTFE), TOSZ (Tonen SilaZen), FSG (Fluoride Silicate Glass), polyimide nanofoams such as polypropylene oxide, CDO (Carbon Doped silicon Oxide), OSG (Organo Silicate Glass), SiLK, Amorphous Fluorinated Carbon, silica aerogels, silica xerogels, mesoporous silica, or combinations thereof.

A first source/drain contact 180 may be on the first source/drain pattern 150. The first source/drain contact 180 may be connected to the first source/drain pattern 150. The first source/drain contact 180 may pass through the first interlayer insulating film 190 and the source/drain etching stop film 185, and may be connected to the first source/drain pattern 150.

A second source/drain contact 280 may be on the second source/drain pattern 250. The second source/drain contact 280 may be connected to the second source/drain pattern 250.

A first contact silicide film 155 may be between the first source/drain contacts 180 and the first source/drain patterns 150. A second contact silicide film 255 may be between the second source/drain contact 280 and the second source/drain pattern 250.

In an implementation, as illustrated in the drawings, each of the first source/drain contact 180 and the second source/drain contact 280 may be a single film. The first source/drain contact 180 and the second source/drain contact 280 each may include, e.g., a metal, a metal alloy, a conductive metal nitride, a conductive metal carbide, a conductive metal oxide, a conductive metal carbonitride, or a two-dimensional material (2D material).

The first contact silicide film 155 and the second contact silicide film 255 may include metal silicide.

The second interlayer insulating film 191 may be on the first interlayer insulating film 190, the first gate structure GS1, the second gate structure GS2, the first source/drain contact 180, and the second source/drain contact 280.

The second interlayer insulating film 191 may include, e.g., silicon oxide, silicon nitride, silicon carbonitride, silicon oxynitride, or a low dielectric constant material.

A wiring structure 205 may be inside the second interlayer insulating film 191. The wiring structure 205 may include a via plug 206 and a wiring line 207. The wiring structure 205 may be connected to the first source/drain contact 180 and the second source/drain contact 280.

The via plug 206 and the wiring line 207 may each include, e.g., a metal, a metal alloy, a conductive metal nitride, a conductive metal carbide, a conductive metal oxide, a conductive metal carbonitride, or a two-dimensional material.

In an implementation, as illustrated in the drawings, the via plug 206 and the wiring line 207 may each be a single film. In an implementation, the via plug 206 and the wiring line 207 may have an integral structure.

Figure 7:
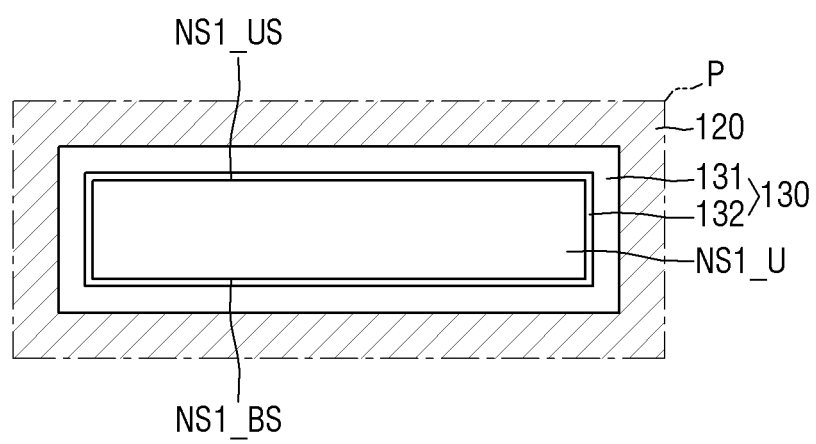
FIG. 7 is a diagram for explaining a semiconductor device according to some embodiments.

FIG. 7 is a diagram for explaining a semiconductor device according to some embodiments. For convenience of explanation, the explanation will focus on points that are different from those explained using FIGS. 1 to 6. For reference, FIG. 7 is an enlarged view of a portion P of FIG. 4.

Referring to FIG. 7, in the semiconductor device according to some embodiments, the first gate insulating film 130 may include a first lower gate insulating film 132 and a first upper gate insulating film 131.

The first upper gate insulating film 131 may be between the first lower gate insulating film 132 and the first gate electrode 120. The first lower gate insulating film 132 and the first upper gate insulating film 131 may each be along the periphery of the first sheet pattern NS1. The first lower gate insulating film 132 may include, e.g., silicon oxide. The first upper gate insulating film 131 may include a high dielectric constant material.

In an implementation, the first lower gate insulating film 132 may extend along the upper surface BP2_US of the second lower pattern, and may not extend along the upper surface of the first field insulating film (105 of FIG. 4). The first lower gate insulating film 132 may not extend along the side walls of the first gate electrode 120.

The first upper gate insulating film 131 may extend along the upper surface of the first field insulating film 105 and the upper surface BP1_US of the first lower pattern. The first upper gate insulating film 131 may extend along the side walls of the first gate electrode 120.

Figure 8:
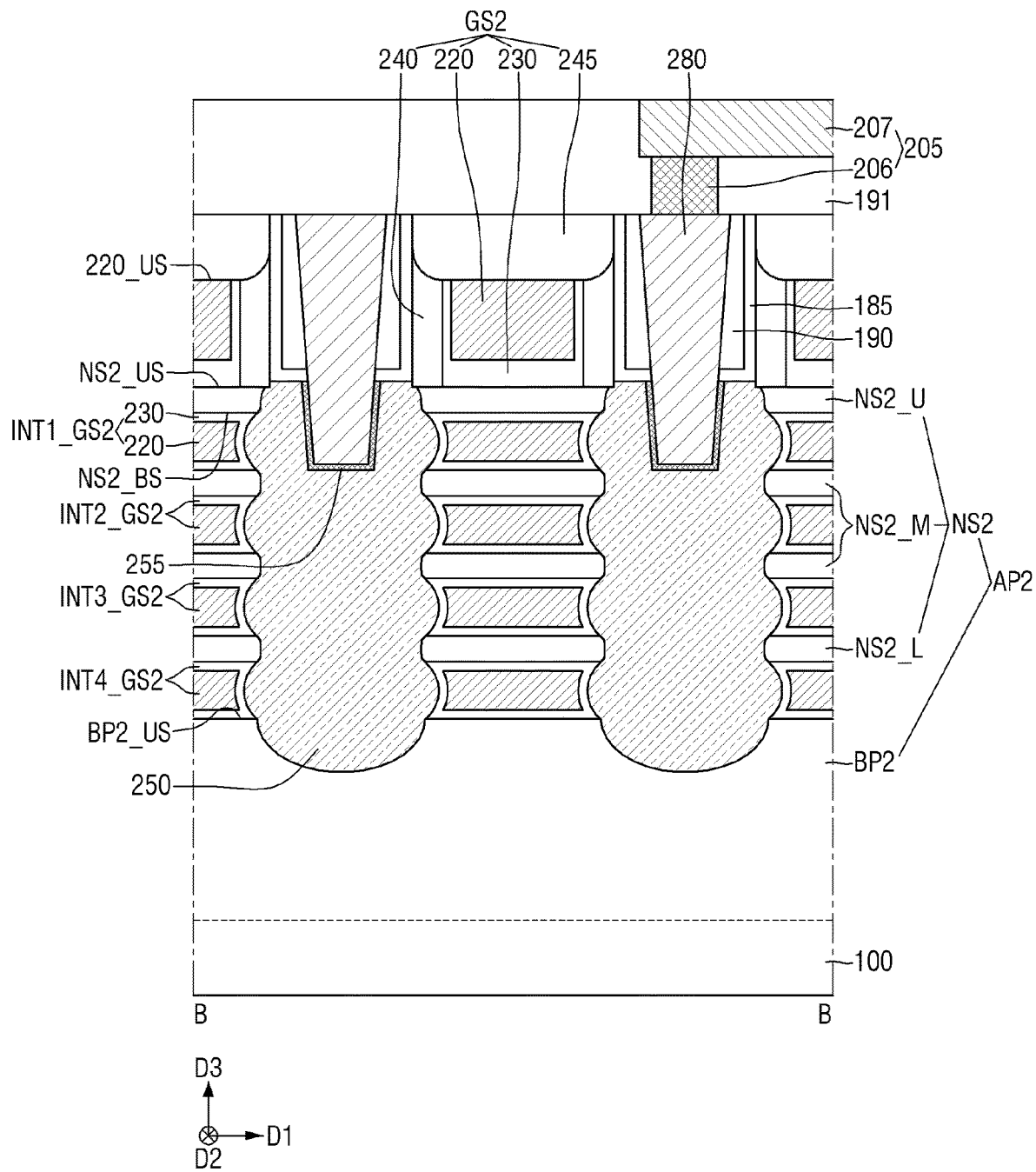
FIGS. 8 to 10 are diagrams for explaining a semiconductor device according to some embodiments.
Figure 9:
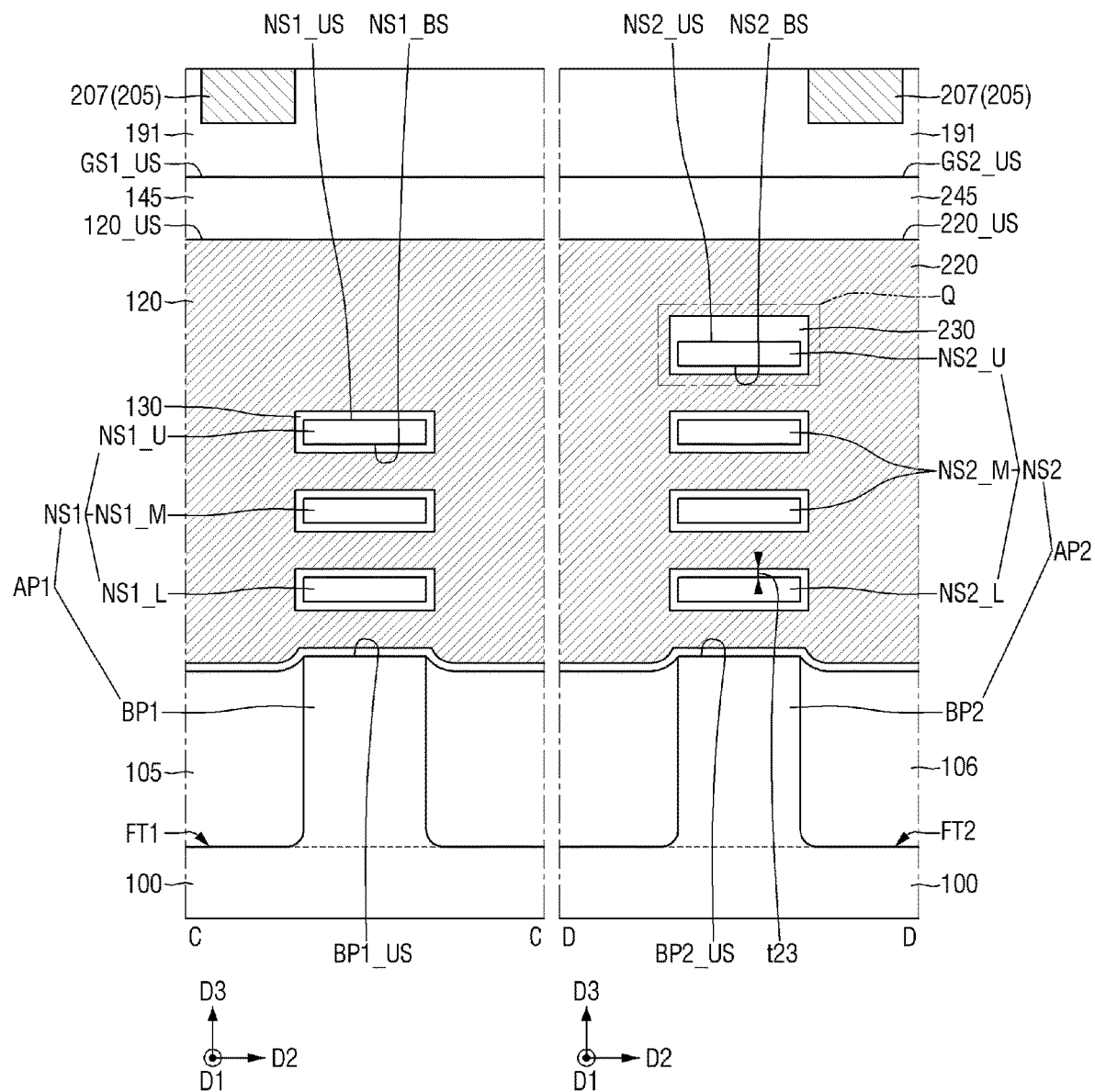
Figure 10:
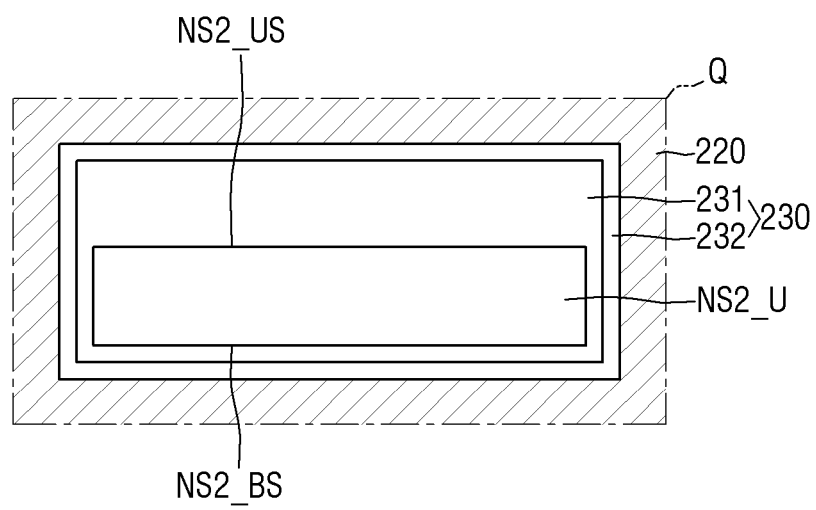

FIGS. 8 to 10 are diagrams for explaining a semiconductor device according to some embodiments. For convenience of explanation, the explanation will focus on points that are different from those explained using FIGS. 1 to 6. For reference, FIG. 10 is an enlarged view of a portion Q of FIG. 9.

Referring to FIGS. 8 to 10, in the semiconductor device according to some embodiments, the second gate insulating film 230 may include a second lower gate insulating film 231 and a second upper gate insulating film 232.

The second upper gate insulating film 232 may be between the second lower gate insulating film 231 and the second gate electrode 220. The second lower gate insulating film 231 and the second upper gate insulating film 232 may each be along the periphery of the second sheet pattern NS2.

The second lower gate insulating film 231 may include, e.g., silicon oxide. The second upper gate insulating film 232 may include a high dielectric constant material.

A thickness of the second lower gate insulating film 231 on the upper surface NS2_US of the second uppermost sheet pattern may be greater than a thickness of the second lower gate insulating film 231 on the lower surface NS2_BS of the second uppermost sheet pattern. The thickness of the second upper gate insulating film 232 on the upper surface NS2_US of the second uppermost sheet pattern may be the same as a thickness of the second upper gate insulating film 232 on the lower surface NS2_BS of the second uppermost sheet pattern.

The second gate insulating film 230 may extend along the upper surface of the second field insulating film 106 and the upper surface BP2_US of the second lower pattern. The second lower gate insulating film 231 may extend along the upper surface BP2_US of the second lower pattern, and may not extend along the upper surface of the second field insulating film 106. The second lower gate insulating film 231 may not extend along the side walls of the second gate electrode 220.

The second upper gate insulating film 232 may extend along the upper surface of the second field insulating film 106 and the upper surface BP2_US of the second lower pattern. The second upper gate insulating film 232 may extend along side walls of the second gate electrode 220.

Figure 11:
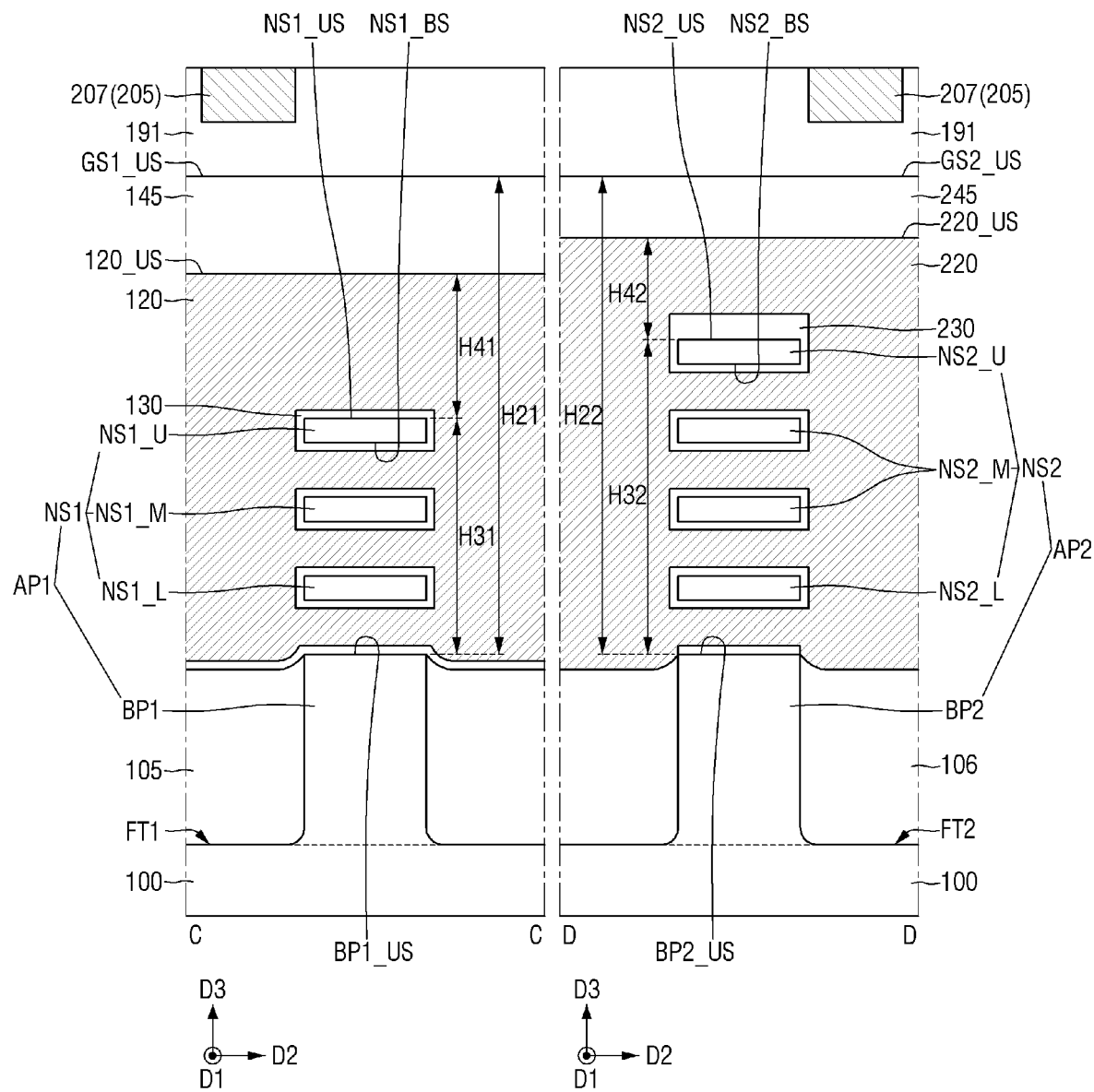
FIG. 11 is a diagram for explaining a semiconductor device according to some embodiments.

FIG. 11 is a diagram for explaining a semiconductor device according to some embodiments. For convenience of explanation, the explanation will focus on points that are different from those explained using FIGS. 1 to 6.

Referring to FIG. 11, in the semiconductor device according to some embodiments, a height (H31+H41) from the upper surface BP1_US of the first lower pattern to the upper surface 120_US of the first gate electrode may differ from a height (H32+H42) from the upper surface BP2_US of the second lower pattern to the upper surface 220_US of the second gate electrode.

In an implementation, the height (H31+H41) from the upper surface BP1_US of the first lower pattern to the upper surface 120_US of the first gate electrode may be smaller than the height (H32+H42) from the upper surface BP2_US of the second lower pattern to the upper surface 220_US of the second gate electrode. A thickness (H21-H31-H41) of the first gate capping pattern 145 may be greater than a thickness (H22-H32-H42) of the second gate capping pattern 245.

On the basis of the upper side of the substrate 100, the upper surface 120_US of the first gate electrode may be lower than the upper surface 220_US of the second gate electrode. The upper surface of the gate electrode in the region in which fewer sheet patterns are disposed may be lower than the upper surface of the gate electrode in the region in which more sheet patterns are disposed.

Figure 12:
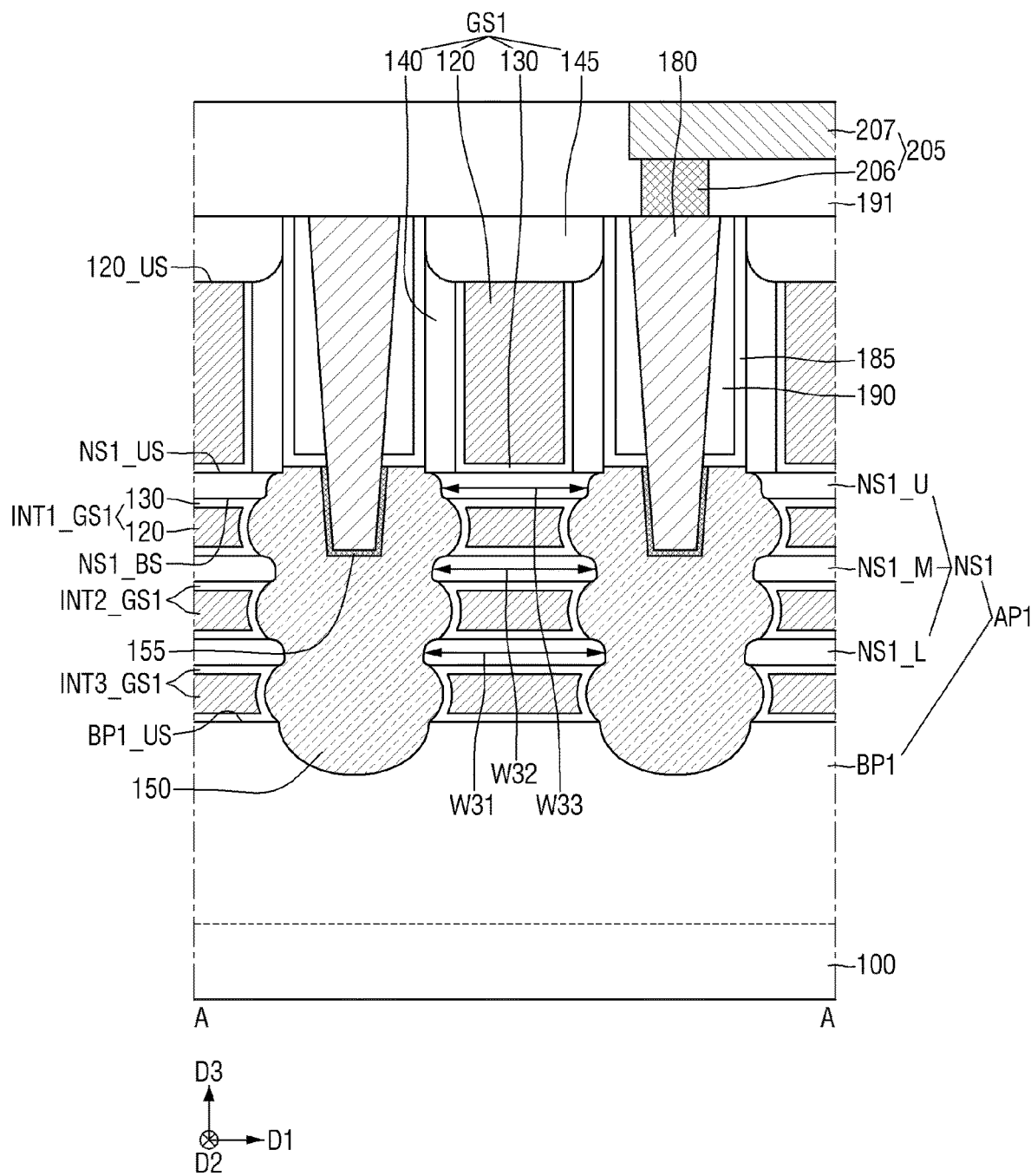
FIGS. 12 and 13 are diagrams for explaining a semiconductor device according to some embodiments.
Figure 13:
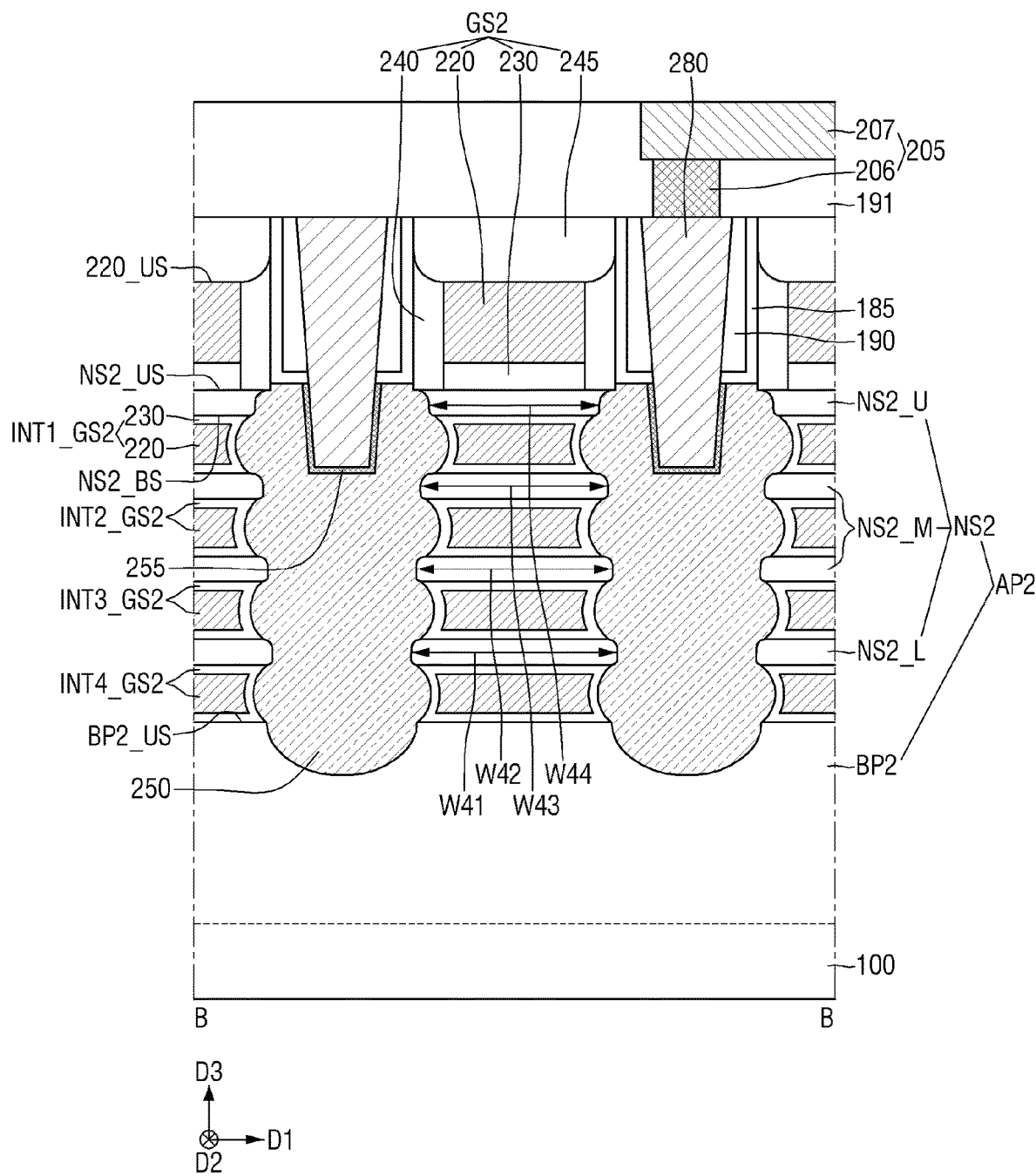

FIGS. 12 and 13 are diagrams for explaining a semiconductor device according to some embodiments. For convenience of explanation, the explanation will focus on points that are different from those explained using FIGS. 1 to 6.

Referring to FIGS. 12 and 13, in the semiconductor device according to some embodiments, a width W31 of the first lowermost sheet pattern NS1_L in the first direction D1 may be greater than a width W32 of the first intermediate sheet pattern NS1_M in the first direction D1.

A width W33 of the first uppermost sheet pattern NS1_U in the first direction D1 may be smaller than the width W32 of the first intermediate sheet pattern NS1_M in the first direction D1. The width of the first sheet pattern NS1 in the first direction D1 may decrease as it goes away from the first lower pattern BP1.

A width W41 of the second lowermost sheet pattern NS2_L in the first direction D1 may be greater than widths W42 and W43 of the second intermediate sheet pattern NS2_M in the first direction D1. A width W44 of the second uppermost sheet pattern NS2_U in the first direction D1 may be smaller than the widths W42 and W43 of the second intermediate sheet pattern NS2_M in the first direction D1.

When the second sheet pattern NS2 includes a plurality of second intermediate sheet patterns NS2_M, the width W42 of the second intermediate sheet pattern NS2_M close to the second lower pattern BP2 may be greater than the width W43 of the second intermediate sheet pattern NS2_M far from the second lower pattern BP2.

Figure 14:
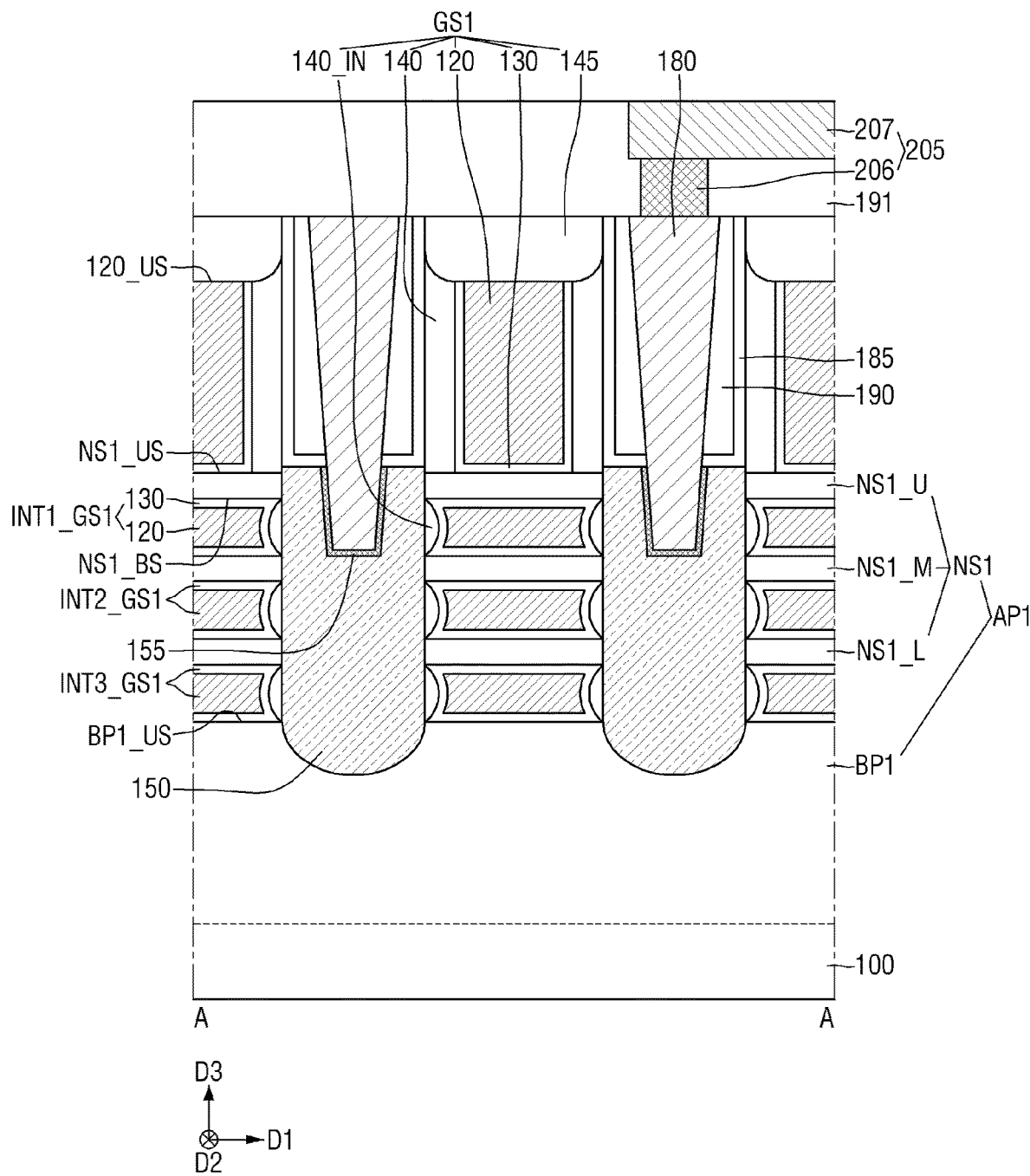
FIGS. 14 and 15 are diagrams for explaining a semiconductor device according to some embodiments.
Figure 15:
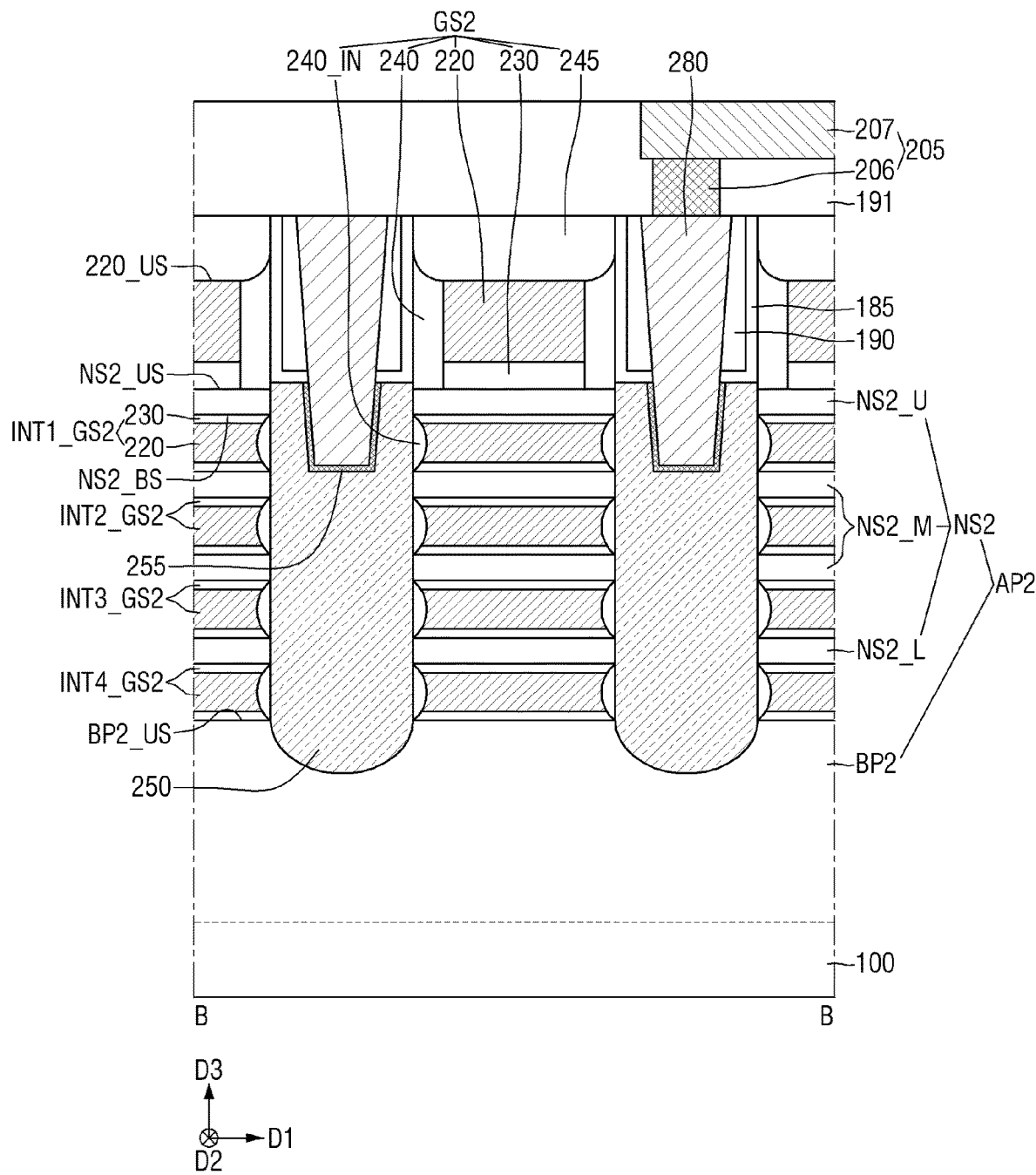

FIGS. 14 and 15 are diagrams for explaining a semiconductor device according to some embodiments. For convenience of explanation, the explanation will focus on points that are different from those explained using FIGS. 1 to 6.

Referring to FIGS. 14 and 15, in the semiconductor device according to some embodiments, the first gate structure GS1 may further include a plurality of first inner spacers 140_IN. The second gate structure GS2 may further include a plurality of second inner spacers 240_IN.

A first inner spacer 140_IN may be between the first sheet patterns NS1 adjacent in the third direction D3, and between the first lower pattern BP1 and the first sheet pattern NS1. The first inner spacer 140_IN may be between the upper surface BP1_US of the first lower pattern and the lower surface NS1_BS of the first lowermost sheet pattern, and between the upper surface NS1_US of the first sheet pattern and the lower surface NS1_BS of the first sheet pattern that face each other in the third direction D3.

The first inner spacer 140_IN may be between the first inner gate structures INT1_GS1, INT2_GS1, and INT3_GS1 and the first source/drain pattern 150. The first inner gate structures INT1_GS1, INT2_GS1, and INT3_GS1 may not be in contact with the first source/drain patterns 150.

A second inner spacer 240_IN may be between the second sheet patterns NS2 adjacent in the third direction D3, and between the second lower pattern BP2 and the second sheet pattern NS2. The second inner spacer 240_IN may be between the upper surface BP2_US of the second lower pattern and the lower surface NS2_BS of the second lowermost sheet pattern, and between the upper surface NS2_US of the second sheet pattern and the lower surface NS2_BS of the second sheet pattern that face each other in the third direction D3.

The second inner spacer 240_IN may be between the second inner gate structures INT1_GS2, INT2_GS2, INT3_GS2, and INT4_GS2 and the second source/drain patterns 250. The second inner gate structures INT1_GS2, INT2_GS2, INT3_GS2, and INT4_GS2 may not come into contact with the second source/drain pattern 250.

In an implementation, the second gate insulating film 230 may not extend along the side wall of the second inner spacers 240_IN.

In an implementation, one of the first gate structure GS1 and the second gate structure GS2 may not include an inner spacer.

Figure 16:
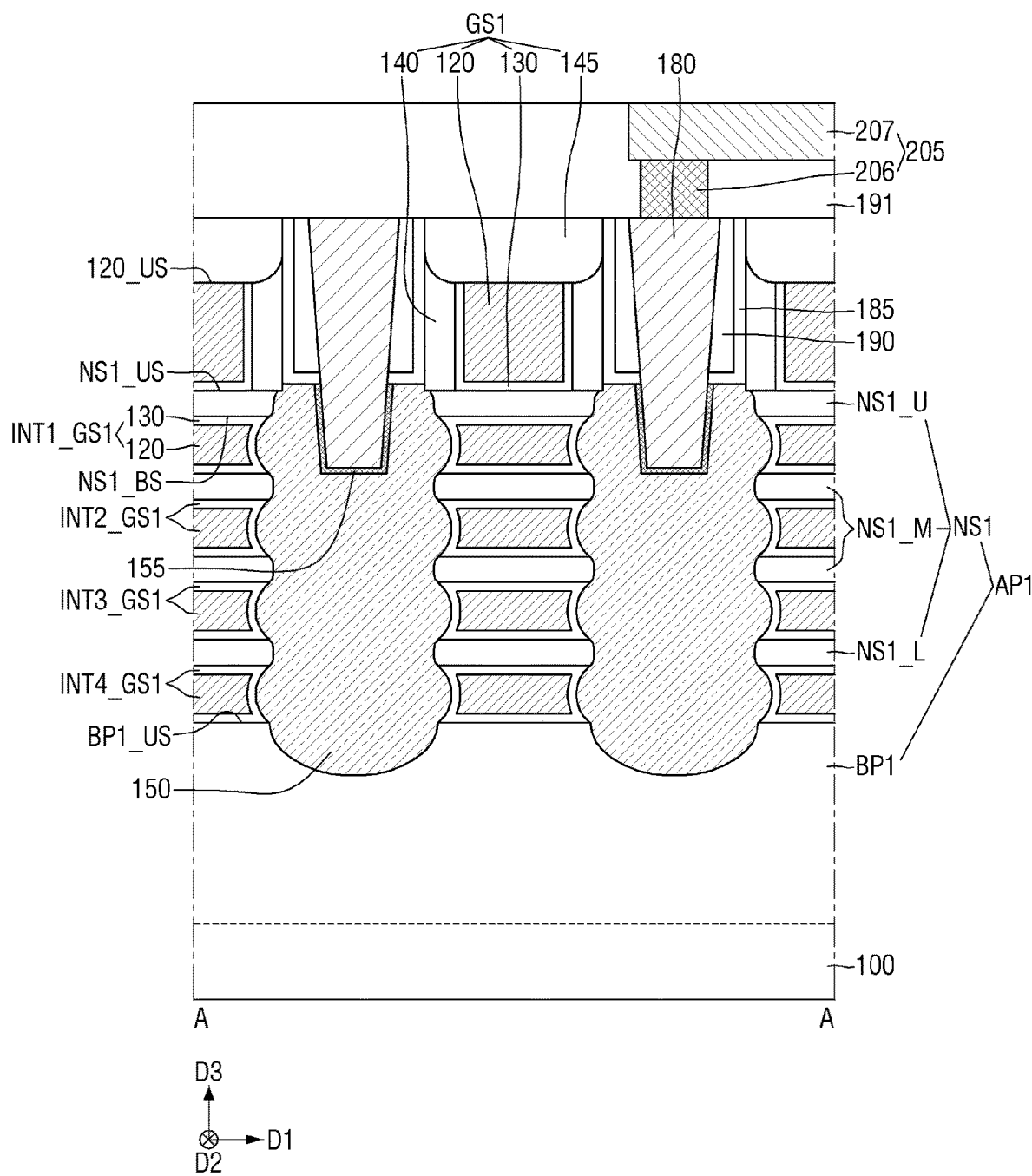
FIGS. 16 and 17 are diagrams for explaining a semiconductor device according to some embodiments.
Figure 17:
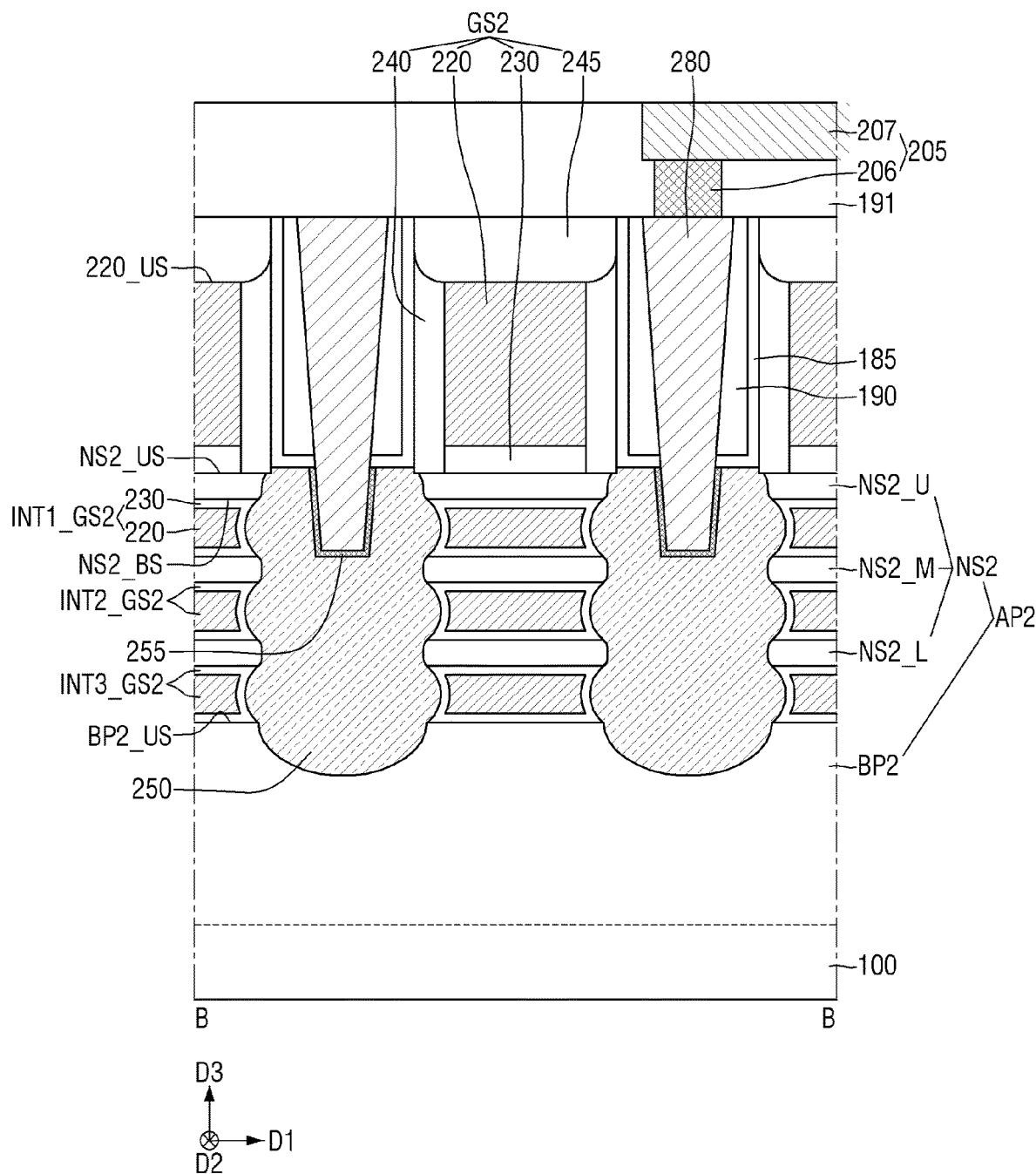

FIGS. 16 and 17 are diagrams for explaining a semiconductor device according to some embodiments. For convenience of explanation, the explanation will focus on points that are different from those explained using FIGS. 1 to 6.

Referring to FIGS. 16 and 17, in the semiconductor device according to some embodiments, the number of first sheet patterns NS1 may be greater than the number of second sheet patterns NS2.

The number of first intermediate sheet patterns NS1_M may be greater than the number of second intermediate sheet patterns NS2_M. In an implementation, the second sheet pattern NS2 may not include an intermediate sheet pattern, and the first sheet pattern NS1 may include the first intermediate sheet pattern NS1_M.

In an implementation, the first region I may be an SRAM region, and the second region II may be an I/O region.

A height from the upper surface NS1_US of the first uppermost sheet pattern to the upper surface 120_US of the first gate electrode may be smaller than a height from the upper surface NS2_US of the second uppermost sheet pattern to the upper surface 220_US of the second gate electrode.

The number of first inner gate structures INT1_GS1, INT2_GS1, INT3_GS1, and INT4_GS1 included in the first gate structure GS1 may be greater than the number of second inner gate structures INT1_GS2, INT2_GS2, and INT3_GS2 included in the second gate structure GS2.

Figure 18:
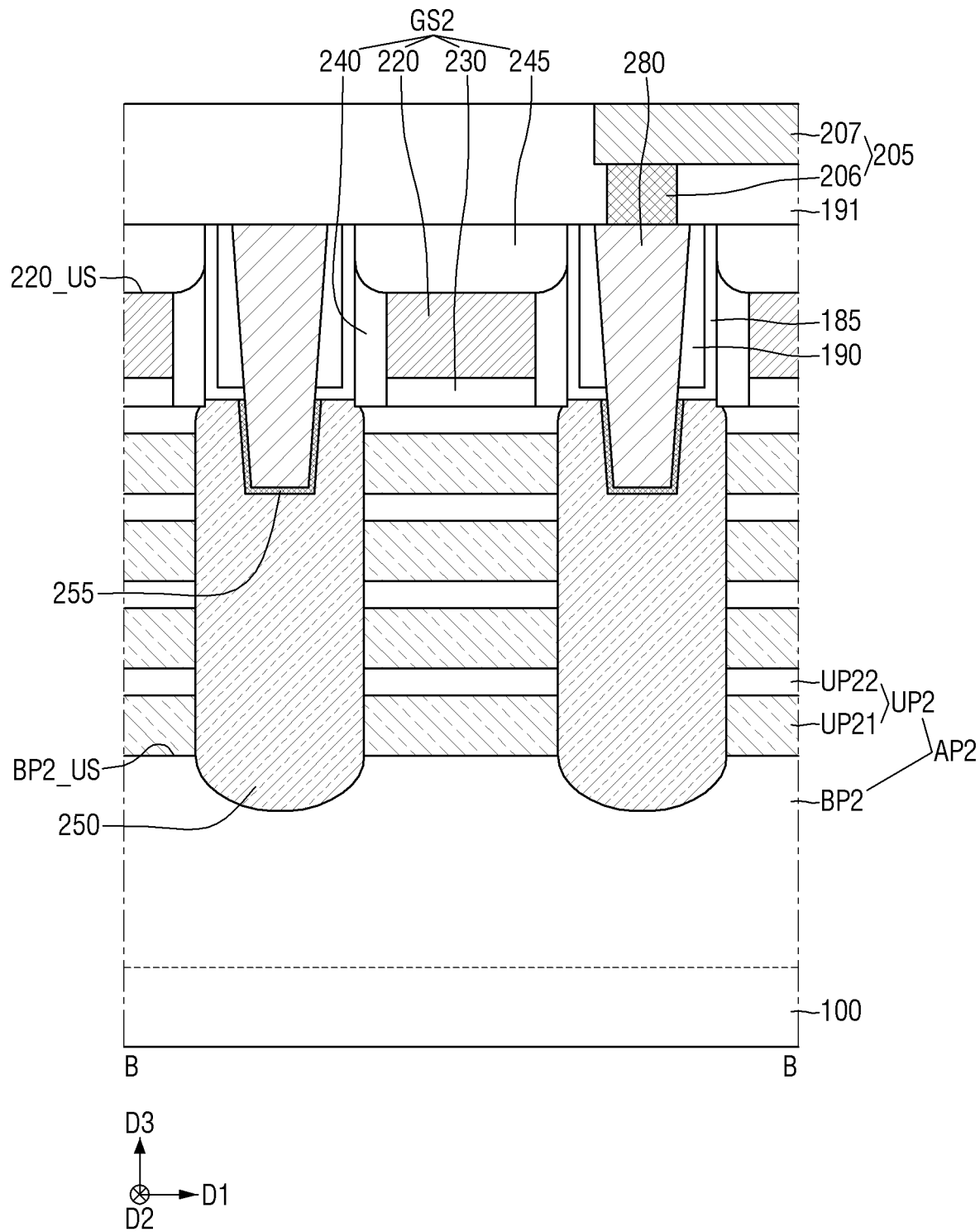
FIGS. 18 and 19 are diagrams for explaining a semiconductor device according to some embodiments.
Figure 19:
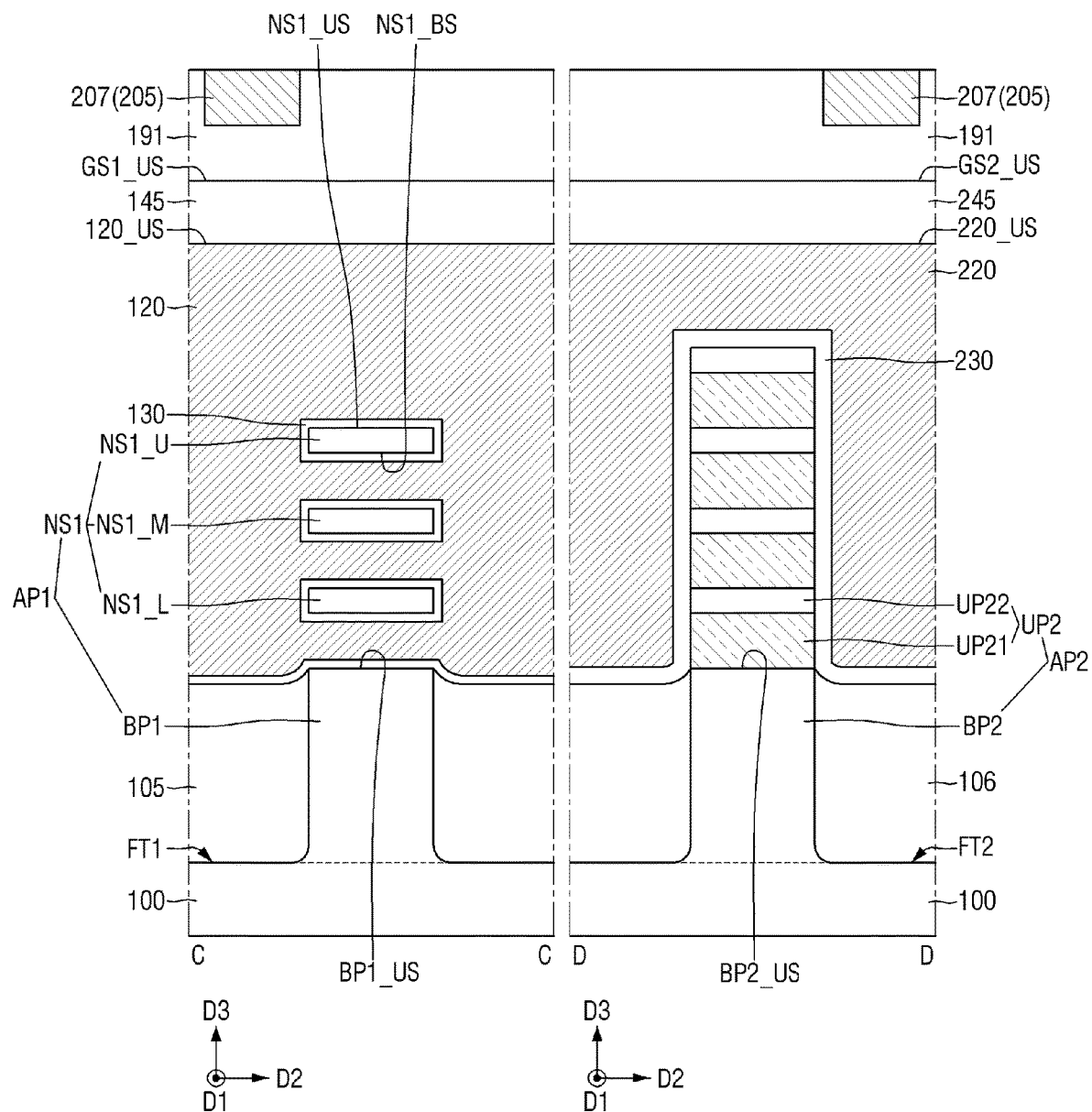

FIGS. 18 and 19 are diagrams for explaining a semiconductor device according to some embodiments. For convenience of explanation, the explanation will focus on points that are different from those explained using FIGS. 1 to 6. For reference, FIG. 18 is a cross-sectional view taken along B-B of FIG. 1. FIG. 4 is a cross-sectional view taken along C-C and D-D of FIG. 1.

Referring to FIGS. 18 and 19, in the semiconductor device according to some embodiments, a second active pattern AP2 may include a second lower pattern BP2 and a channel pattern UP2.

The channel pattern UP2 may be on the second lower pattern BP2. The channel pattern UP2 may contact the upper surface BP2_US of the second lower pattern.

The channel pattern UP2 may include a lower channel pattern UP21 and an upper channel pattern UP22 that are alternately stacked on the second lower pattern BP2. The upper channel pattern UP22 may include the same material as the first sheet pattern NS1. When the upper channel pattern UP22 is a silicon pattern, the lower channel pattern UP21 may be, e.g., a silicon-germanium pattern.

In an implementation, the number of lower channel patterns UP21 may be the same as the number of upper channel patterns UP22. The number of upper channel patterns UP22 may be greater than the number of first sheet patterns NS1.

The second gate insulating film 230 may extend along the profile of the channel pattern UP2 and the upper surface of the second field insulating film 106. The thickness of the second gate insulating film 230 may be greater than the thickness t11 of the first gate insulating film 130 on the upper surface (NS1_US of FIG. 4) of the first uppermost sheet pattern.

The second source/drain pattern 250 may be connected to the channel pattern UP2.

Figure 20:
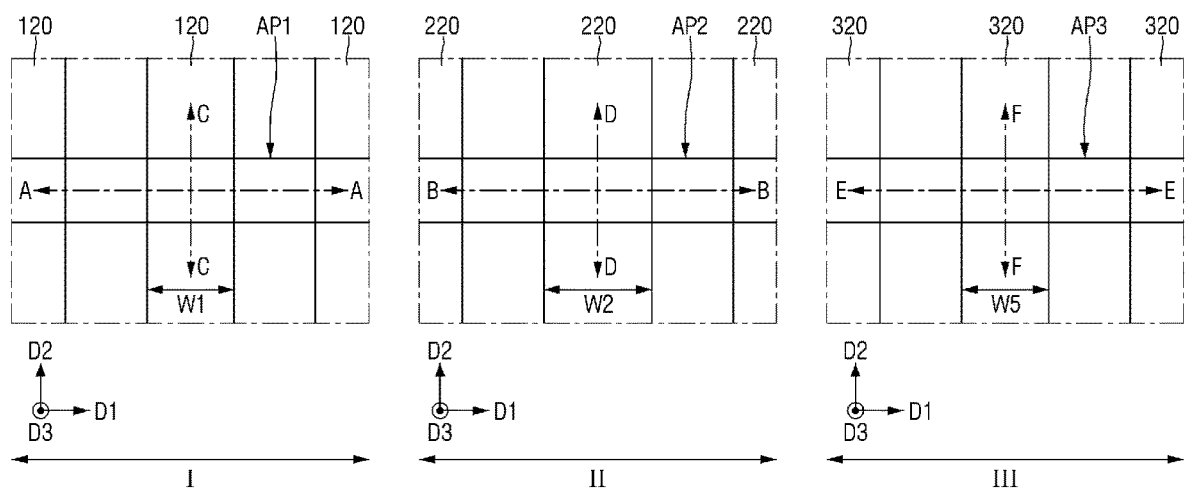
FIG. 20 is an example layout diagram for explaining a semiconductor device according to some embodiments.
Figure 21:
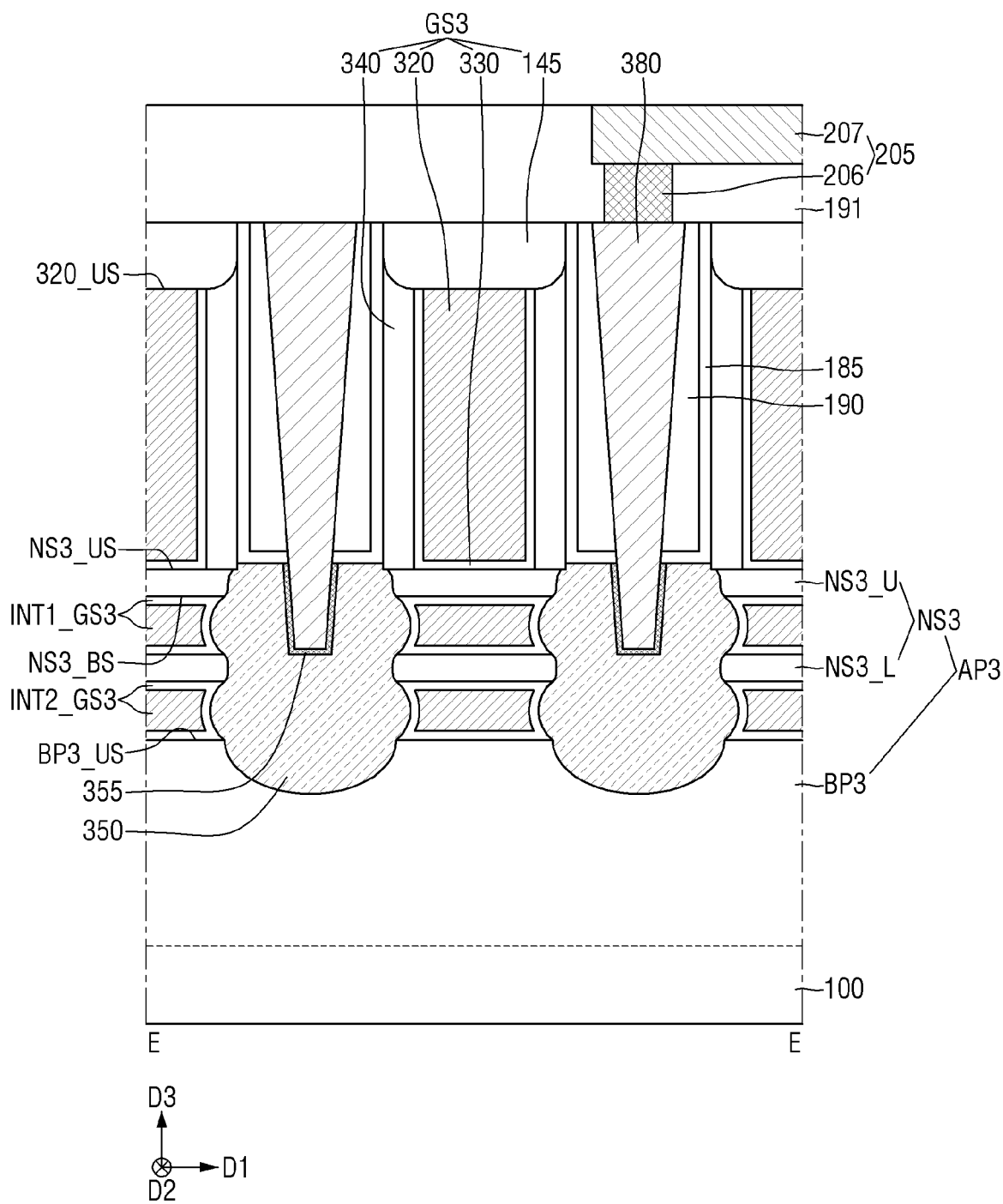
FIG. 21 is a cross-sectional view taken along a line E-E of FIG. 20.
Figure 22:
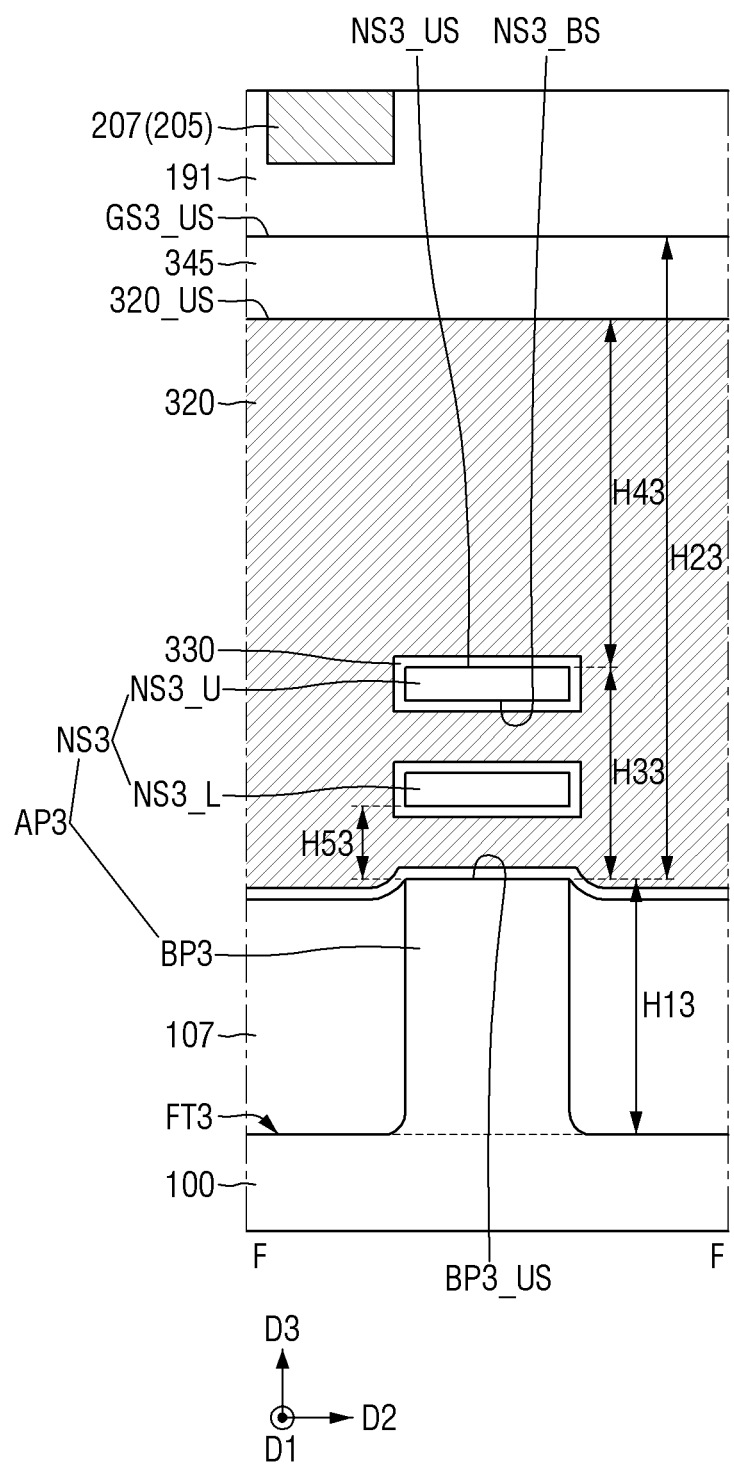
FIG. 22 is a cross-sectional view taken along a line F-F of FIG. 20.

FIG. 20 is an example layout diagram for explaining a semiconductor device according to some embodiments. FIG. 21 is a cross-sectional view taken along a line E-E of FIG. 20. FIG. 22 is a cross-sectional view taken along a line F-F of FIG. 20.

For reference, the explanations regarding the first region I and the second region II of FIG. 20 may be substantially the same as those explained using FIGS. 1 to 15. Therefore, the following explanation will focus on the third region III of FIG. 20.

Referring to FIGS. 20 to 22, the semiconductor device according to some embodiments may further include a third active pattern AP3, a plurality of third gate electrodes 320, and a third source/drain pattern 350.

The substrate 100 may include a first region I, a second region II, and a third region III. In an implementation, the first region I may be a logic region, the second region II may be an I/O region, and the third region III may be an SRAM region. The third active pattern AP3, the plurality of third gate electrodes 320, and the third source/drain pattern 350 may be on the third region III of the substrate 100.

The third lower pattern BP3 may protrude from the substrate 100. The third lower pattern BP3 may extend lengthwise in the first direction D1. The third lower pattern BP3 may be defined by the third fin trench FT3. A height H13 of the third lower pattern BP3 may be the same as a height (H11 of FIG. 4) of the first lower pattern BP1.

A plurality of third sheet patterns NS3 may be on the upper surface BP3_US of the third lower pattern. The third sheet pattern NS3 may include a third lowermost sheet pattern NS3_L and a third uppermost sheet pattern NS3_U. Each third sheet pattern NS3 may include an upper surface NS3_US and a lower surface NS3_BS.

The number of third sheet patterns NS3 may be smaller than the number of first sheet patterns NS1. In an implementation, the number of first sheet patterns NS1 included in the first active pattern AP1 in the logic region may be greater than the number of third sheet patterns included in the third active pattern AP3 in the SRAM region.

In an implementation, the third sheet pattern NS3 may not include the intermediate sheet pattern. The number of first intermediate sheet patterns NS1_M may be smaller than the number of second intermediate sheet patterns NS2_M.

In an implementation, the third sheet pattern NS3 may include an intermediate sheet pattern. The number of intermediate sheet patterns included in the third sheet pattern NS3 may be smaller than the number of first intermediate sheet patterns NS1_M.

A height (H51 of FIG. 4) from the upper surface BP1_US of the first lower pattern to the lower surface NS1_BS of the first lowermost sheet pattern may be same as a height H53 from the upper surface BP3_US of the third lower pattern to the lower surface NS3_BS of the third lowermost sheet pattern. The height (H31 of FIG. 4) from the upper surface BP1_US of the first lower pattern to the upper surface NS1_US of the first uppermost sheet pattern may be greater than a height (H33) from the upper surface BP3_US of the third lower pattern to the upper surface NS3_US of the third uppermost sheet pattern.

The third lower pattern BP3 may include the same material as the first lower pattern BP1. The third sheet pattern NS3 may include the same material as the first sheet pattern NS3.

A third field insulating film 107 may be on the substrate 100. The third field insulating film 107 may be on the side walls of the third lower pattern BP3. The third field insulating film 107 may fill the third fin trench FT3.

A plurality of third gate structures GS3 may be on the substrate 100. Each third gate structure GS3 may extend in the second direction D2. The third gate structures GS3 may be spaced apart in the first direction D1.

The third gate structure GS3 may be on the third active pattern AP3. The third gate structure GS3 may intersect the third active pattern AP3. The third gate structure GS3 may intersect the third lower pattern BP3. The third gate structure GS3 may wrap the respective third sheet patterns NS3. The third gate structure GS3 may include, e.g., a third gate electrode 320, a third gate insulating film 330, a third gate spacer 340, and a third gate capping pattern 345.

The third gate structure GS3 may include a plurality of third inner gate structures INT1_GS3 and INT2_GS3 which are between the third sheet patterns NS3 adjacent in the third direction D3, and between the third lower pattern BP3 and the third sheet pattern NS3.

The third gate electrode 320 may be on the third lower pattern BP3. The third gate electrode 320 may intersect the third lower pattern BP3. The third gate electrode 320 may wrap the third sheet pattern NS3. A width W1 of the first gate electrode 120 in the first direction D1 may be the same as a width W3 of the third gate electrode 320 in the first direction D1.

A height (H41 of FIG. 4) from the upper surface NS1_US of the first uppermost sheet pattern to the upper surface 120_US of the first gate electrode may be smaller than a height H43 from the upper surface NS3_US of the third uppermost sheet pattern to the upper surface 320_US of the third gate electrode. A height (H31+H41 of FIG. 4) from the upper surface BP1_US of the first lower pattern to the upper surface 120_US of the first gate electrode may be the same as a height (H33+H43) from the upper surface BP3_US of the third lower pattern to the upper surface 320_US of the third gate electrode.

The third gate insulating film 330 may extend along the upper surface of the third field insulating film 107 and the upper surface BP3_US of the third lower pattern. The third gate insulating film 330 may extend along the side walls of the third gate electrode 320. The third gate insulating film 330 may be along the periphery of the third sheet pattern NS3. The third gate insulating film 330 may include a high dielectric constant material having a dielectric constant greater than that of silicon oxide.

The third gate insulating film 330 may be at the same level as the first gate insulating film 130. Here, the term "same level" means that they are formed by the same manufacturing process. The thickness of the third gate insulating film 330 may be the same as the thickness of the first gate insulating film 130.

A third gate spacer 340 may be on the side wall of the third gate electrode 320. A third gate capping pattern 345 may be on the third gate electrode 320 and the third gate spacer 340.

An upper surface of the third gate capping pattern 345 may be the upper surface GS3_US of the third gate structure. A height (H21 of FIG. 4) from the upper surface BP1_US of the first lower pattern to the upper surface GS1_US of the first gate structure may be the same as a height H23 from the upper surface BP3_US of the third lower pattern to the upper surface GS3_US of the third gate structure.

A third source/drain pattern 350 may be on the third active pattern AP3. The third source/drain pattern 350 may be on the third lower pattern BP3. The third source/drain pattern 350 may be connected to the plurality of third sheet patterns NS3. The third source/drain pattern 350 may contact the third sheet pattern NS3.

A third source/drain contact 380 may be on the third source/drain pattern 350. The third source/drain contact 380 may be connected to the third source/drain pattern 350. A third contact silicide film 355 may be between the third source/drain contact 380 and the third source/drain pattern 350.

Figure 23:
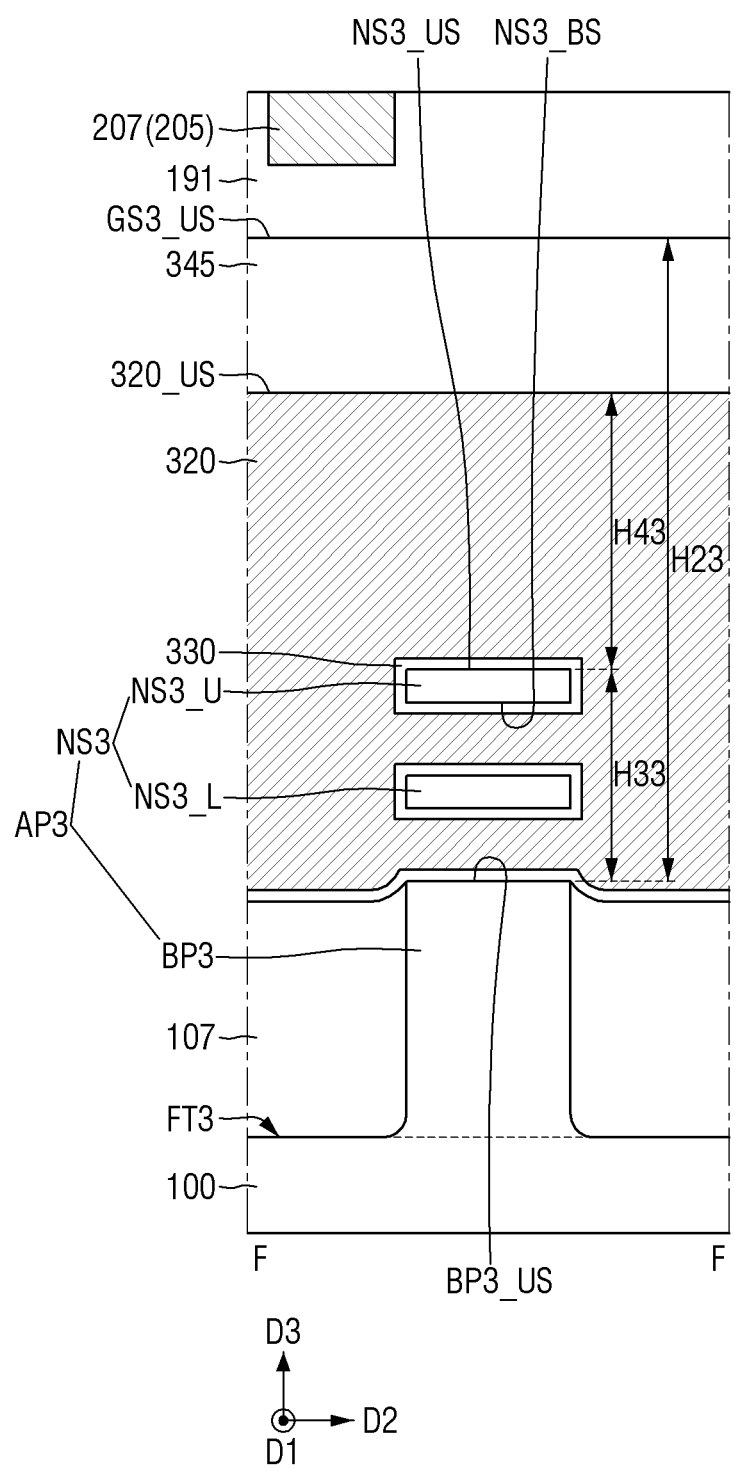
FIG. 23 is a diagram for explaining a semiconductor device according to some embodiments.

FIG. 23 is a diagram for explaining a semiconductor device according to some embodiments. For convenience of explanation, the explanation will focus on points different from those explained using FIGS. 20 to 23.

Referring to FIGS. 11 and 23, in the semiconductor device according to some embodiments, a height (H33+H43) from the upper surface BP3_US of the third lower pattern to the upper surface 320_US of the third gate electrode may be different from a height (H31+H41) from the upper surface BP1_US of the first lower pattern to the upper surface 120_US of the first gate electrode. A height (H33+H43) from the upper surface BP3_US of the third lower pattern to the upper surface 320_US of the third gate electrode may be different from a height (H32+H42) from the upper surface BP2_US of the second lower pattern to the upper surface 220_US of the second gate electrode.

In an implementation, the height (H33+H43) from the upper surface BP3_US of the third lower pattern to the upper surface 320_US of the third gate electrode may be smaller than the height (H31+H41) up to the upper surface 120_US of the first gate electrode. The height (H33+H43) from the upper surface BP3_US of the third lower pattern to the upper surface 320_US of the third gate electrode may be smaller than the height (H32+H42) up to the upper surface 220_US of the second gate electrode. The height (H31+H41) from the upper surface BP1_US of the first lower pattern to the upper surface 120_US of the first gate electrode may be smaller than the height (H32+H42) from the upper surface BP2_US of the second lower pattern to the upper surface 220_US of the second gate electrode.

A thickness (H23-H33-H43) of the third gate capping pattern 345 may be greater than a thickness (H21-H31-H41) of the first gate capping pattern 145. The thickness (H23-H33-H43) of the third gate capping pattern 345 may be greater than a thickness (H22-H32-H42) of the second gate capping pattern 245.

By way of summation and review, a multi gate transistor may use a three-dimensional channel, and scaling may be easily performed. Further, even if a gate length of the multi gate transistor were not increased, the current control capability could be improved. Furthermore, a SCE (short channel effect) in which potential of a channel region is influenced by a drain voltage may be effectively suppressed.

On or more embodiments may provide a semiconductor device capable of improving element performance and reliability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
   a substrate including a first region and a second region;
   a first active pattern on the first region of the substrate, the first active pattern including:
      a first lower pattern extending in a first direction, and
      a plurality of first sheet patterns spaced apart from the first lower pattern in a vertical direction;
   a second active pattern on the second region of the substrate, the second active pattern including:
      a second lower pattern extending in the first direction, a height of the second lower pattern in the vertical direction being identical to a height of the first lower pattern in the vertical direction, and
      a plurality of second sheet patterns spaced apart from the second lower pattern in the vertical direction;
   a first gate structure on the first lower pattern, the first gate structure including a first gate insulating film and a first gate electrode extending in a second direction that crosses the first direction;

a second gate structure on the second lower pattern, the second gate structure including a second gate insulating film, and a second gate electrode extending in the second direction, a width of the second gate electrode in the first direction being greater than a width of the first gate electrode in the first direction;

a first source/drain pattern on the first lower pattern, the first source/drain pattern being connected to the plurality of first sheet patterns; and a second source/drain pattern on the second lower pattern, the second source/drain pattern being connected to the plurality of second sheet patterns, wherein a number of first sheet patterns in the plurality of first sheet patterns is smaller than a number of second sheet patterns in the plurality of second sheet patterns.

2. The semiconductor device as claimed in claim 1, wherein:
the plurality of first sheet patterns includes a first uppermost sheet pattern,
the plurality of second sheet patterns includes a second uppermost sheet pattern, and
a height from an upper surface of the first lower pattern to an upper surface of the first uppermost sheet pattern in the vertical direction is smaller than a height from an upper surface of the second lower pattern to an upper surface of the second uppermost sheet pattern in the vertical direction.

3. The semiconductor device as claimed in claim 2, wherein a height from the upper surface of the first uppermost sheet pattern to the upper surface of the first gate electrode in the vertical direction is greater than a height from the upper surface of the second uppermost sheet pattern to the upper surface of the second gate electrode in the vertical direction.

4. The semiconductor device as claimed in claim 2, wherein a thickness of the first gate insulating film on the upper surface of the first uppermost sheet pattern in the vertical direction is smaller than a thickness of the second gate insulating film on the upper surface of the second uppermost sheet pattern in the vertical direction.

5. The semiconductor device as claimed in claim 2, wherein a height from the upper surface of the first lower pattern to an upper surface of the first gate structure in the vertical direction is identical to a height from the upper surface of the second lower pattern to an upper surface of the second gate structure in the vertical direction.

6. The semiconductor device as claimed in claim 2, wherein:
the plurality of first sheet patterns includes a first lowermost sheet pattern,
the plurality of second sheet patterns includes a second lowermost sheet pattern, and
a height from the upper surface of the first lower pattern to a lower surface of the first lowermost sheet pattern in the vertical direction is identical to a height from the upper surface of the second lower pattern to a lower surface of the second lowermost sheet pattern in the vertical direction.

7. The semiconductor device as claimed in claim 1, wherein:
the first region is a logic region or SRAM region, and
the second region is an I/O region.

8. The semiconductor device as claimed in claim 1, wherein:
the substrate further includes a third region,
the semiconductor device further includes:

a third active pattern on the third region of the substrate, the third active pattern including a third lower pattern extending in the first direction, and at least one third sheet pattern spaced apart from the third lower pattern in the vertical direction; and a third gate structure on the third lower pattern, the third gate structure including a third gate insulating film and a third gate electrode extending in the second direction, a height of the third lower pattern in the vertical direction is identical to a height of the first lower pattern in the vertical direction, and a number of third sheet patterns in the at least one third sheet pattern is smaller than the number of first sheet patterns in the plurality of first sheet patterns.

9. The semiconductor device as claimed in claim 8, wherein a width of the third gate electrode in the first direction is identical to a width of the first gate electrode in the first direction.

10. The semiconductor device as claimed in claim 8, wherein:
the first region is a logic region,
the second region is an I/O region, and
the third region is an SRAM region.

11. A semiconductor device, comprising:
a substrate including a first region and a second region;
a first active pattern on the first region of the substrate, the first active pattern including:
a first lower pattern extending in a first direction, and
a plurality of first sheet patterns spaced apart from the first lower pattern in a vertical direction;
a second active pattern on the second region of the substrate, the second active pattern including:
a second lower pattern extending in the first direction, and
a plurality of second sheet patterns spaced apart from the second lower pattern in the vertical direction;
a first gate structure on the first lower pattern, the first gate structure including a first gate insulating film and a first gate electrode extending in a second direction that crosses the first direction;
a second gate structure on the second lower pattern, the second gate structure including:
a second gate insulating film, and
a second gate electrode extending in the second direction, a width of the second gate electrode in the first direction being different from a width of the first gate electrode in the first direction;
a first source/drain pattern on the first lower pattern, the first source/drain pattern being connected to a plurality of the first sheet patterns; and
a second source/drain pattern on the second lower pattern, the second source/drain pattern being connected to a plurality of the second sheet patterns,
wherein:
a number of first sheet patterns in the plurality of first sheet patterns is smaller than a number of the second sheet patterns in the plurality of second sheet patterns,
the plurality of first sheet patterns includes a first uppermost sheet pattern,
the plurality of second sheet patterns includes a second uppermost sheet pattern, and
a height from an upper surface of the first uppermost sheet pattern to an upper surface of the first gate electrode in the vertical direction is greater than a height from an upper surface of the second uppermost sheet pattern to an upper surface of the second gate electrode in the vertical direction.

12. The semiconductor device as claimed in claim 11, wherein:
the first region is an SRAM region and the second region is an I/O region, and
a width of the second gate electrode in the first direction is greater than a width of the first gate electrode in the first direction.

13. The semiconductor device as claimed in claim 11, wherein:
the first region is an I/O region and the second region is an SRAM region, and
a width of the second gate electrode in the first direction is smaller than a width of the first gate electrode in the first direction.

14. The semiconductor device as claimed in claim 11, wherein:
the plurality of first sheet patterns includes a first lowermost sheet pattern,
the plurality of second sheet patterns includes a second lowermost sheet pattern, and
a height from an upper surface of the first lower pattern to a lower surface of the first lowermost sheet pattern in the vertical direction is identical to a height from an upper surface of the second lower pattern to a lower surface of the second lowermost sheet pattern in the vertical direction.

15. The semiconductor device as claimed in claim 14, wherein a width of the first lowermost sheet pattern in the first direction is greater than a width of the first uppermost sheet pattern in the first direction.

16. The semiconductor device as claimed in claim 11, wherein a height from an upper surface of the first lower pattern to an upper surface of the first gate structure in the vertical direction is identical to a height from an upper surface of the second lower pattern to an upper surface of the second gate structure in the vertical direction.

17. A semiconductor device, comprising:
a substrate including a SRAM region and an I/O region;
a first active pattern on the SRAM region of the substrate, the first active pattern including:
a first lower pattern extending in a first direction, and
a plurality of first sheet patterns spaced apart from the first lower pattern in a vertical direction;
a second active pattern on the I/O region of the substrate, the second active pattern including:
a second lower pattern extending in the first direction, and
a plurality of second sheet patterns spaced apart from the second lower pattern in the vertical direction;
a first gate structure on the first lower pattern, the first gate structure including a first gate insulating film and a first gate electrode extending in a second direction that crosses the first direction;
a second gate structure on the second lower pattern, the second gate structure including a second gate insulating film and a second gate electrode extending in the second direction;
a first source/drain pattern on the first lower pattern, the first source/drain pattern being connected to the plurality of first sheet patterns; and
a second source/drain pattern on the second lower pattern, the second source/drain pattern being connected to the plurality of second sheet patterns,
wherein:
a number of first sheet patterns in the plurality of first sheet patterns is smaller than a number of second sheet patterns in the plurality of second sheet patterns,
the plurality of first sheet patterns includes a first uppermost sheet pattern,
the plurality of second sheet patterns includes a second uppermost sheet pattern, and
a thickness of the first gate insulating film on an upper surface of the first uppermost sheet pattern in the vertical direction is smaller than a thickness of the second gate insulating film on an upper surface of the second uppermost sheet pattern in the vertical direction.

18. The semiconductor device as claimed in claim 17, wherein:
the first gate insulating film includes a different material from the second gate insulating film, and
a dielectric constant of the first gate insulating film is greater than a dielectric constant of the second gate insulating film.

19. The semiconductor device as claimed in claim 17, wherein a thickness of the second gate insulating film on the upper surface of the second uppermost sheet pattern in the vertical direction is greater than a thickness of the second gate insulating film on a lower surface of the second uppermost sheet pattern in the vertical direction.

20. The semiconductor device as claimed in claim 17, wherein:
the plurality of second sheet patterns includes a second lowermost sheet pattern, and
a thickness of the second gate insulating film on the upper surface of the second uppermost sheet pattern in the vertical direction is greater than a thickness of the second gate insulating film on an upper surface of the second lowermost sheet pattern in the vertical direction.

* * * * *